(12) United States Patent
Imamura et al.

(10) Patent No.: US 10,167,403 B2
(45) Date of Patent: *Jan. 1, 2019

(54) INK, INK CONTAINER, AND METHOD FOR PRODUCING FUNCTIONAL ELEMENT

(71) Applicant: SEIKO EPSON CORPORATION, Tokyo (JP)

(72) Inventors: Koji Imamura, Kai-shi (JP); Takuya Sonoyama, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/919,539

(22) Filed: Mar. 13, 2018

(65) Prior Publication Data

US 2018/0201801 A1    Jul. 19, 2018

Related U.S. Application Data

(62) Division of application No. 15/248,437, filed on Aug. 26, 2016, now Pat. No. 9,951,241.

(30) Foreign Application Priority Data

Sep. 2, 2015 (JP) .................................. 2015-172603

(51) Int. Cl.
*C09D 11/52* (2014.01)
*B41J 2/01* (2006.01)
(Continued)

(52) U.S. Cl.
CPC ................. *C09D 11/52* (2013.01); *B41J 2/01* (2013.01); *B41J 11/002* (2013.01); *C09D 11/36* (2013.01);
(Continued)

(58) Field of Classification Search
CPC combination set(s) only.
See application file for complete search history.

(56) References Cited

U.S. PATENT DOCUMENTS 5,504,510 A * 4/1996 Miyakawa ........... B41J 2/17506
347/85
6,870,584 B2 * 3/2005 Kawase ............... B41J 2/14233
349/106
(Continued)

FOREIGN PATENT DOCUMENTS

EP    1 601 032 A2    11/2005
JP    H07-133454 A     5/1995
(Continued)

OTHER PUBLICATIONS

Jan. 20, 2017 European Search Report issued in European Patent Application No. 16186677.7
(Continued)

*Primary Examiner* — Matthew Luu
*Assistant Examiner* — Lily Kemathe
(74) *Attorney, Agent, or Firm* — Oliff PLC

(57) ABSTRACT

An ink according to an embodiment includes a functional layer forming material, wherein the ejection amount of a droplet ejected from a nozzle of an inkjet head is 9.5 ng or more and 11 ng or less, and the length of the droplet when the droplet is ejected from the nozzle at an ejection velocity of 6 m/sec or more and 9 m/sec or less is 250 μm or less.

12 Claims, 19 Drawing Sheets

(51) Int. Cl.
*B41J 11/00* (2006.01)
*C09D 11/36* (2014.01)
*H01L 51/00* (2006.01)
*H01L 51/56* (2006.01)
*H01L 51/50* (2006.01)
*H01L 27/32* (2006.01)

(52) U.S. Cl.
CPC ........ *H01L 51/005* (2013.01); *H01L 51/0005* (2013.01); *H01L 51/56* (2013.01); *H01L 27/322* (2013.01); *H01L 51/5012* (2013.01); *H01L 51/5056* (2013.01); *H01L 51/5088* (2013.01)

(56) References Cited

U.S. PATENT DOCUMENTS

| | | | | |
|---|---|---|---|---|
| 7,004,555 B2* | 2/2006 | Sugahara | ............. | B41J 2/04516 347/10 |
| 7,341,333 B2* | 3/2008 | Sugahara | ............... | B41J 2/1433 347/74 |
| 7,371,487 B2* | 5/2008 | Bae | ........................ | G02B 5/201 427/164 |
| 7,954,916 B2* | 6/2011 | Sugahara | ................. | B41J 2/211 347/10 |
| 8,148,945 B2* | 4/2012 | Watanabe | ............. | H02H 9/001 320/128 |
| 9,653,685 B2* | 5/2017 | Watanabe | ........... | H01L 51/0007 |
| 2002/0014470 A1 | 2/2002 | Okada et al. | | |
| 2004/0046825 A1* | 3/2004 | Sugahara | ............. | B41J 2/04516 347/21 |
| 2009/0117261 A1* | 5/2009 | Sakai | ................... | B41J 2/04541 427/66 |
| 2009/0315521 A1* | 12/2009 | Watanabe | ............. | H02H 9/001 320/166 |
| 2011/0121021 A1* | 5/2011 | Dudenhoefer | ....... | B41J 2/04535 222/1 |
| 2012/0162307 A1 | 6/2012 | Yamazaki | | |
| 2012/0249636 A1 | 10/2012 | Kitabayashi | | |
| 2013/0065024 A1 | 3/2013 | Aruga et al. | | |
| 2013/0256636 A1* | 10/2013 | Watanabe | ........... | H01L 51/0037 257/40 |
| 2014/0138655 A1* | 5/2014 | Sonoyama | .......... | H01L 51/0005 257/40 |
| 2016/0053123 A1 | 2/2016 | Tanaka et al. | | |
| 2017/0120592 A1* | 5/2017 | Sakai | ................... | B41J 2/14088 |

FOREIGN PATENT DOCUMENTS

| | | |
|---|---|---|
| JP | 2007-103381 A | 4/2007 |
| JP | 2011-230501 A | 11/2011 |
| JP | 2012-136589 A | 7/2012 |
| JP | 2012-209216 A | 10/2012 |
| JP | 2014-218078 A | 11/2014 |

OTHER PUBLICATIONS

Jul. 11, 2017 Office Action issued in U.S. Appl. No. 15/248,437.
Dec. 18, 2017 Notice of Allowance issued in U.S. Appl. No. 15/248,437.

\* cited by examiner

FIG.34

| NO. | EVALUATION ITEM | EXAMPLE 1 | EXAMPLE 2 | EXAMPLE 3 | COMPARATIVE EXAMPLE 1 | COMPARATIVE EXAMPLE 2 |
|---|---|---|---|---|---|---|
| 1 | STABLE EJECTION CAN BE PERFORMED IN EJECTION AMOUNT OF 9.5 TO 11 ng | OK | OK | OK | OK | OK |
| 2 | DRIVING VOLTAGE WHEN 10 ng IS EJECTED IS 23.0 (V) OR LESS | OK | OK | OK | NG | NG |
| 3 | EJECTION RATE OF DROPLET WHEN 10 ng IS EJECTED IS FROM 6 TO 9 m/s | OK | OK | OK | OK | NG |
| 4 | LENGTH OF DROPLET WHEN 10 ng IS EJECTED IS 250 μm OR LESS | OK | OK | OK | NG | NG |
| | OVERALL DETERMINATION | OK | OK | OK | NG | NG |

INK, INK CONTAINER, AND METHOD FOR PRODUCING FUNCTIONAL ELEMENT

CROSS-REFERENCE TO RELATED APPLICATIONS

This application is a divisional of U.S. application Ser. No. 15/248,437 filed Aug. 26, 2016, which is based on and claims priority under 35 U.S.C. 119 from Japanese Patent Application No. 2015-172603 filed on Sep. 2, 2015. The contents of the above applications are incorporated herein by reference.

BACKGROUND

1. Technical Field

The present invention relates to an ink containing a functional layer forming material, an ink container, and a method for producing a functional element using the ink.

2. Related Art

There has been known a droplet ejection method (or also referred to as "inkjet method") for forming, for example, a functional layer including a light-emitting layer disposed in a pixel of an organic electroluminescence (EL) device, or a colored layer of a color filter used in a liquid crystal display device using an inkjet head capable of ejecting a liquid body (ink) as a droplet.

In such a droplet ejection method, an applied film having a desired film thickness is required to be formed by reliably placing a droplet ejected from an inkjet head in a region which is divided by a partition wall and in which the applied film is formed.

For example, JP-A-2007-103381 (PTL 1) discloses an ink composition, which is applied by an inkjet method in the production of an organic EL element, contains a hole injection material or a light-emitting material, and has a viscosity of 1 to 20 mPa·s (sec), a surface tension of 20 to 70 mN/m, and a contact angle with a material constituting a nozzle surface of an inkjet head of 30 to 17° (degree). It is said that by using such an ink composition, the clogging of a nozzle hole and the flight curve of an ink droplet are suppressed, and also the ejection of an ink droplet is made smooth, and therefore, the ejection amount and the ejection timing can be controlled, and thus, stable ejection of an ink droplet can be realized.

However, even if the physical properties such as viscosity, surface tension, and contact angle of an ink composition are specified as disclosed in PTL 1, a droplet ejected from a nozzle of an inkjet head is not reliably placed in a region where an applied film is formed in some cases. For example, when a droplet is ejected by decreasing the ejection amount, the flight of the droplet is unstable or when a droplet is ejected by increasing the ejection amount, the droplet is ejected in a state of leaving a tail behind, and thus, there is a problem that the ejected droplet cannot be reliably landed in a desired region.

SUMMARY

An advantage of some aspects of the invention is to solve at least part of the problems described above and the invention can be implemented as the following aspects or application examples.

Application Example

An ink according to this application example is an ink, which contains a functional layer forming material ejected as a droplet from a nozzle of an inkjet head, wherein the ejection amount of the droplet is 9.5 ng or more and 11 ng or less, and the length of the droplet when the droplet is ejected from the nozzle at an ejection velocity of 6 m/sec or more and 9 m/sec or less is 250 μm or less.

According to the ink according to this application example, the respective ranges of the ejection amount of a droplet, the ejection velocity, and the length of a droplet are defined, and therefore, an ink capable of stably landing a droplet in a desired region from a nozzle of an inkjet head can be provided.

In the ink according to the application example, it is preferred that the inkjet head includes a piezoelectric element as a driving element provided for each nozzle, and a driving voltage for the piezoelectric element when the ejection amount of the droplet is 10 ng is 15 V or more and 32 V or less.

According to this configuration, the driving voltage is 15 V or more and 32 V or less, and therefore, a droplet can be ejected in a stable ejection amount from the nozzle. Specifically, in the case where the piezoelectric element is driven at a low driving voltage of less than 15 V, it is difficult to eject a droplet in a stable ejection amount from the nozzle, and a droplet may not be ejected from the nozzle. On the other hand, in the case where the piezoelectric element is driven at a high driving voltage exceeding 32 V, due to heat emitted from the piezoelectric element, the physical properties of the ink may vary, resulting in varying the ejection amount. That is, the driving voltage is preferably 15 V or more and 32 V or less.

In the ink according to the application example, it is preferred that as the functional layer forming material, any of a hole injection layer forming material, a hole transport layer forming material, and a light-emitting layer forming material is contained.

According to this configuration, an ink capable of stably landing a predetermined amount of the ink as a droplet in a desired region from a nozzle of an inkjet head is provided, and therefore, an ink capable of forming a hole injection layer, a hole transport layer, and a light-emitting layer, each having a desired film thickness in a desired region can be provided.

In the ink according to the application example, it is preferred that as the functional layer forming material, a colored layer forming material for a color filter is contained.

According to this configuration, an ink capable of stably landing a predetermined amount of the ink as a droplet in a desired region from a nozzle of an inkjet head is provided, and therefore, an ink capable of forming a colored layer having a desired film thickness in a desired region can be provided.

In the ink according to the application example, it is preferred that as the functional layer forming material, an organic semiconductor layer forming material is contained.

According to this configuration, an ink capable of stably landing a predetermined amount of the ink as a droplet in a desired region from a nozzle of an inkjet head is provided, and therefore, an ink capable of forming an organic semiconductor layer having a desired film thickness in a desired region can be provided.

Application Example

An ink container according to this application example is filled with the ink according to the above application example.

According to the ink container according to this application example, an ink capable of stably landing a droplet in a desired region from a nozzle of an inkjet head can be supplied to the inkjet head.

Application Example

A method for producing a functional element according to this application example includes forming a partition wall which divides a film forming region, forming an applied film by using the ink according to the above application example and ejecting a predetermined amount of the ink as a droplet from a nozzle of an inkjet head in the film forming region, and forming a functional layer in the film forming region by drying and solidifying the applied film.

According to this application example, an ink capable of stably landing a predetermined amount of the ink as a droplet in a desired region from a nozzle of an inkjet head is used, and therefore, a functional layer having a desired film thickness can be formed in a film forming region. That is, a method for producing a functional element capable of producing a functional element having stable characteristics in high yield can be provided.

BRIEF DESCRIPTION OF THE DRAWINGS

The invention will be described with reference to the accompanying drawings, wherein like numbers reference like elements.

FIG. 13 is a graph showing a relationship between an ejection weight (Iw) and the length of a droplet for the ink of Example 2.

FIG. 34 is a table summarizing the evaluation for the ejection characteristics and the length of a droplet of each of the inks of Examples and Comparative Examples.

DESCRIPTION OF EXEMPLARY EMBODIMENTS

Hereinafter, embodiments embodying the invention will be described with reference to the accompanying drawings. Incidentally, the drawings to be used are displayed by appropriately enlarging or reducing so as to make the components to be described recognizable.

First, a method for producing a functional element according to this embodiment will be described with reference to FIGS. 1 and 2 by showing an organic EL device including an organic EL element as the functional element as an example.

Figure 1:
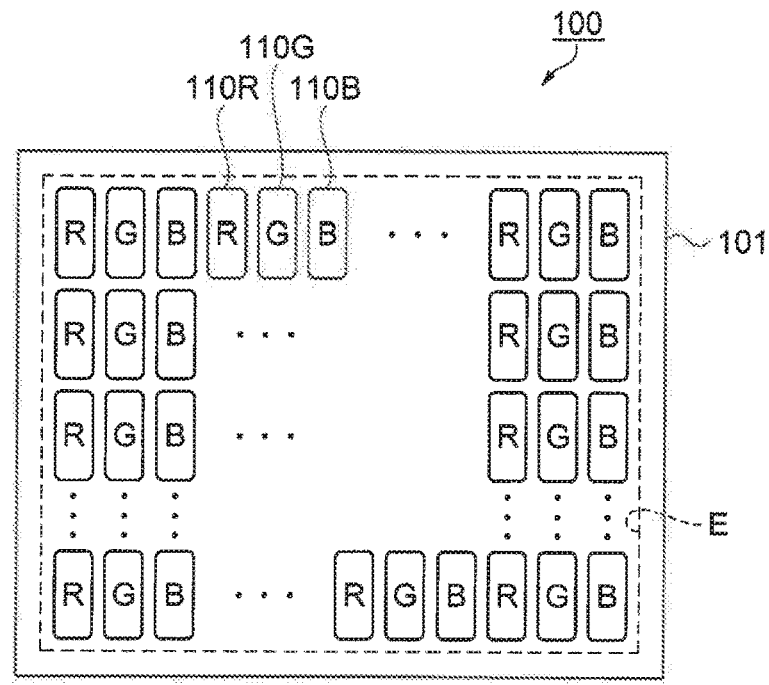
FIG. 1 is a schematic plan view showing a configuration of an organic EL device.
Figure 2:
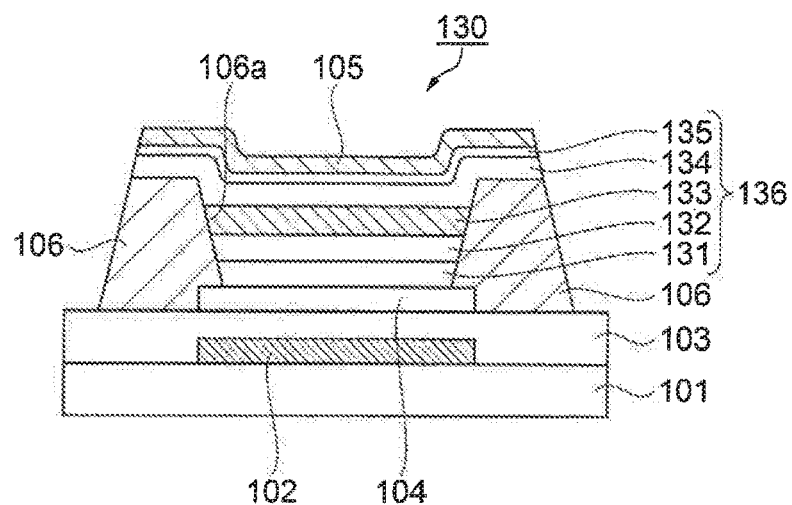
FIG. 2 is a schematic cross-sectional view showing a configuration of an organic EL element.

FIG. 1 is a schematic plan view showing a configuration of an organic EL device, and FIG. 2 is a schematic cross-sectional view showing a configuration of the organic EL element.

Organic EL Device

As shown in FIG. 1, an organic EL device 100 according to this embodiment includes an element substrate 101 on which sub-pixels 110R, 110G, and 110B from which red (R), green (G), and blue (B) light emission (light emission color) is obtained are arranged. Each of the sub-pixels 110R, 110G, and 110B has a substantially rectangular shape, and is arranged in a matrix form in a display region E of the element substrate 101. Hereinafter, the sub-pixels 110R, 110G, and 110B are also sometimes collectively referred to as "sub-pixel 110". The sub-pixels 110 having the same light emission color are arranged in the vertical direction (the column direction or the longitudinal direction of the sub-pixel 110) in the drawing, and the sub-pixels 110 having a different light emission color are arranged in the horizontal direction (the row direction or the lateral direction of the sub-pixel 110) in the drawing in the order of R, G, and B. That is, the sub-pixels 110R, 110G, and 110B having a different light emission color are arranged in a so-called stripe format. The planar shape and arrangement of the sub-pixels 110R, 110G, and 110B are not limited thereto. Further, the substantially rectangular shape includes a quadrangular shape with rounded corners and a quadrangular shape with two opposing sides having an arc shape in addition to a square shape and a rectangular shape.

An organic EL element from which red (R) light emission is obtained is provided in the sub-pixel 110R. Similarly, an organic EL element from which green (G) light emission is obtained is provided in the sub-pixel 110G, and an organic EL element from which blue (B) light emission is obtained is provided in the sub-pixel 110B.

In such an organic EL device 100, the three sub-pixels 110R, 110G, and 110B from which different light emission colors are obtained are taken as one display pixel unit, and the respective sub-pixels 110R, 110G, and 110B are electrically controlled. By doing this, full color display can be achieved.

In each of the sub-pixels 110R, 110G, and 110B, an organic EL element 130 shown in FIG. 2 is provided. The organic EL element 130 includes a reflection layer 102 provided on the element substrate 101, an insulating film 103, a pixel electrode 104, a counter electrode 105, and a functional layer 136 which is provided between the pixel electrode 104 and the counter electrode 105 and includes a light-emitting layer 133.

The pixel electrode 104 functions as an anode, and is provided for each of the sub-pixels 110R, 110G, and 110B, and is formed using a transparent conductive film of, for example, indium tin oxide (ITO) or the like.

The reflection layer 102 provided in the lower layer of the pixel electrode 104 reflects light emitted from the functional layer 136 and transmitted through the pixel electrode 104 having a light transmission property back to the pixel electrode 104 side. The reflection layer 102 is formed using a metal having light reflectivity, for example, aluminum (Al), silver (Ag), or the like, or an alloy thereof, or the like.

Accordingly, the insulating film 103 that covers the reflection layer 102 is provided in order to prevent an electrical short circuit between the reflection layer 102 and the pixel electrode 104. The insulating film 103 is formed using, for example, silicon oxide, silicon nitride, silicon oxynitride, or the like.

The functional layer 136 includes a hole injection layer 131, a hole transport layer 132, a light-emitting layer 133, an electron transport layer 134, and an electron injection layer 135 stacked in this order from the pixel electrode 104 side. In particular, the constituent material of the light-emitting layer 133 is selected according to the light emission color, however, here, these are collectively referred to as "light-emitting layer 133" regardless of the light emission color. The configuration of the functional layer 136 is not limited thereto, and an intermediate layer or the like which controls the movement of a carrier (a hole or an electron) may be provided in addition to these layers.

The counter electrode 105 functions as a cathode, and is provided as a common electrode shared by the sub-pixels 110R, 110G, and 110B, and is formed using an alloy of aluminum (Al) or silver (Ag) and magnesium (Mg), or the like.

A hole is injected as a carrier from the pixel electrode 104 side as an anode to the light-emitting layer 133, and an electron is injected as a carrier from the counter electrode 105 side as a cathode to the light-emitting layer 133. An exciton (in a state where a hole and an electron are bound to each other by a Coulomb force) is formed by a hole and an electron injected in the light-emitting layer 133, and when the exciton disappears (when a hole and an electron are recombined with each other), part of the energy is released as fluorescence or phosphorescence.

In the organic EL device 100, if the counter electrode 105 is configured to have a light transmission property, since the reflection layer 102 is included, it is possible to extract light emitted from the light-emitting layer 133 from the counter electrode 105 side. Such a light emission type is referred to as "top emission type". If the reflection layer 102 is eliminated and the counter electrode 105 is configured to have light reflectivity, it is possible to provide a bottom emission type in which light emitted from the light-emitting layer 133 is extracted from the element substrate 101 side. In this embodiment, a case where the organic EL device 100 is a top emission type device will be described below. The organic EL device 100 of this embodiment is an active driving-type light-emitting device including a pixel circuit capable of independently driving each organic EL element 130 for each of the sub-pixels 110R, 110G, and 110B on the element substrate 101. Since the pixel circuit can adopt a known configuration, the illustration of the pixel circuit is omitted in FIG. 2.

The organic EL device 100 in this embodiment includes a partition wall 106 which overlaps with the outer edge of the pixel electrode 104 in the organic EL element 130 for each of the sub-pixels 110R, 110G, and 110B, and also forms an opening portion 106a on the pixel electrode 104.

In the functional layer 136 of the organic EL element 130 in this embodiment, at least one layer of the hole injection layer 131, the hole transport layer 132, and the light-emitting layer 133 constituting the functional layer 136 is formed by a liquid phase process. The liquid phase process is a method for forming the respective layers by applying a solution containing a component constituting each layer and a solvent to the opening portion 106a as a film forming region surrounded by the partition wall 106 and drying. In order to form the respective layers at a predetermined film thickness, it is necessary to accurately apply a predetermined amount of the solution to the opening portion 106a, and, in this embodiment, an inkjet method (droplet ejection method) is adopted as the liquid phase process. Hereinafter, the solution containing the functional layer forming material and the solvent is referred to as "ink".

In particular, in the organic EL device 100 of a top emission type, light emission unevenness in each of the sub-pixels 110R, 110G, and 110B tends to be conspicuous, and therefore, it is preferred that the cross-sectional shape of each layer constituting the functional layer 136 is flat. A predetermined amount of the ink of this embodiment is uniformly applied to the opening portion 106a and dried so as to make the cross-sectional shape of each layer flat. In consideration of the ejection stability when the ink is ejected as a droplet from a nozzle of an inkjet head, the ink is adjusted so that the parameters such as the ejection amount of the droplet, the ejection velocity, and the length of the droplet fall within the predetermined ranges. The detailed configuration of the ink will be described later.

Method for Producing Organic EL Element

Figure 3:
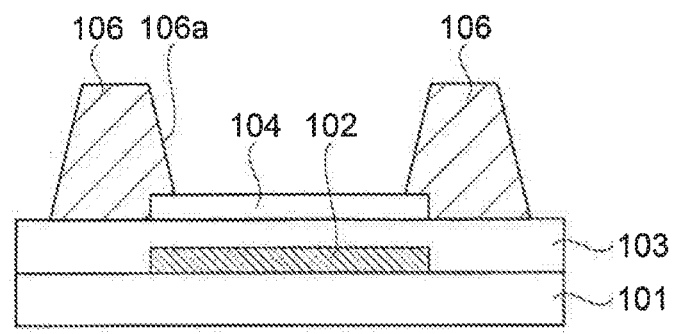
FIG. 3 is a schematic cross-sectional view showing a method for producing an organic EL element.
Figure 4:
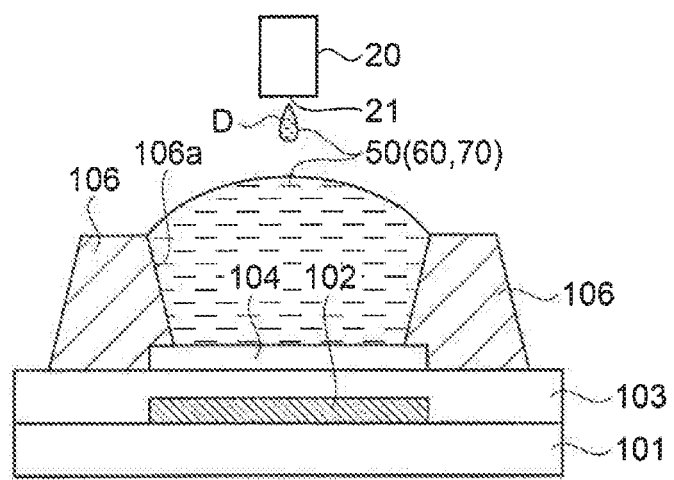
FIG. 4 is a schematic cross-sectional view showing a method for producing an organic EL element.
Figure 5:
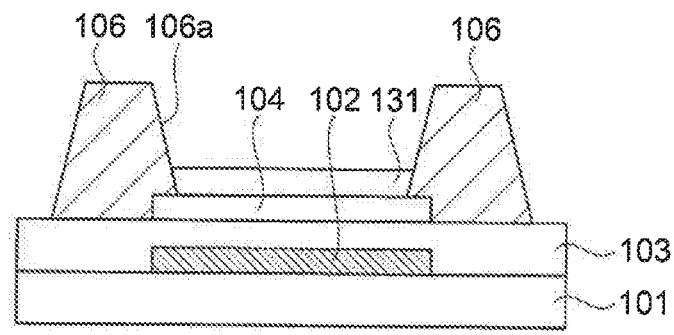
FIG. 5 is a schematic cross-sectional view showing a method for producing an organic EL element.

Next, a method for producing the organic EL element as the functional element of this embodiment will be specifically described with reference to FIGS. 3 to 5. FIGS. 3 to 5 are schematic cross-sectional views showing a method for producing an organic EL element. As described above, a known method can be adopted as a method for forming a pixel circuit which drives and controls the organic EL element 130, or the reflection layer 102 or the pixel electrode 104, and therefore, here, a step of forming a partition wall and the subsequent steps will be described.

The method for producing the organic EL element 130 of this embodiment includes a partition wall formation step (Step S1), a surface treatment step (Step S2), a functional layer formation step (Step S3), and a counter electrode formation step (Step S4).

In the partition wall formation step of Step S1, as shown in FIG. 3, a photosensitive resin layer is formed on the element substrate 101 on which the reflection layer 102 and the pixel electrode 104 are formed by, for example, applying a photosensitive resin material containing a liquid repellent material having liquid repellency to the ink to a thickness of 1 μm to 2 μm, followed by drying. Examples of the application method include a transfer method and a slit coating method. Examples of the liquid repellent material include fluorine compounds and siloxane-based compounds. Examples of the photosensitive resin material include negative polyfunctional acrylic resins. The thus formed photosensitive resin layer is exposed to light and developed using an exposure mask corresponding to the shape of the sub-pixels 110, whereby the partition wall 106 which overlaps with the outer edge of the pixel electrode 104, and also forms the opening portion 106a on the pixel electrode 104 is formed. Then, the process proceeds to Step S2.

In the surface treatment of Step S2, the element substrate 101 on which the partition wall 106 is formed is subjected to a surface treatment. The surface treatment step is performed for the purpose of removing unnecessary materials such as partition wall residues on the surface of the pixel electrode 104 so that the ink containing the functional layer forming material (solid component) wets and spreads uniformly in the opening portion 106a surrounded by the partition wall 106 when forming the hole injection layer 131, the hole transport layer 132, and the light-emitting layer 133 constituting the functional layer 136 by an inkjet method (droplet ejection method) in the subsequent step. In this embodiment, an excimer UV (ultraviolet ray) treatment is performed as the surface treatment method. The surface treatment method is not limited to the excimer UV treatment and may be any as long as the surface of the pixel electrode 104 can be cleaned, and for example, a washing and drying step may be performed using a solvent. If the surface of the pixel electrode 104 is in a clean state, it is not necessary to perform the surface treatment step. In this embodiment, the partition wall 106 is formed using the photosensitive resin material containing a liquid repellent material, however, the invention is not limited thereto, and after forming the partition wall 106 using a photosensitive resin material which does not contain a liquid repellent material, liquid repellency is imparted to the surface of the partition wall 106 by performing a plasma treatment using a fluorine-based treatment gas in Step S2, and thereafter, a surface treatment for making the surface of the pixel electrode 104 lyophilic may be performed by performing a plasma treatment using oxygen as a treatment gas. Then, the process proceeds to Step S3.

In the functional layer formation step of Step S3, first, as shown in FIG. 4, an ink 50 containing a hole injection layer forming material is applied to the opening portion 106a. As the method for applying the ink 50, an inkjet method (droplet ejection method) in which the ink 50 is ejected as a droplet D from the nozzle 21 of the inkjet head 20 is used. The ejection amount of the droplet D ejected from the inkjet head 20 can be controlled in picoliter (pl) order, and the droplets D whose number is calculated by dividing a predetermined amount by the ejection amount of the droplet D is ejected to the opening portion 106a. The ejected ink 50 rounds up in the opening portion 106a due to an interfacial surface tension between the ink and the partition wall 106, but never overflows. In other words, the concentration of the hole injection layer forming material in the ink 50 is adjusted in advance so that the predetermined amount does not cause overflowing of the ink from the opening portion 106a. Then, the process proceeds to the drying step.

In the drying step, for example, decompression drying in which the element substrate 101 to which the ink 50 is applied is left under reduced pressure and dried by evaporating the solvent from the ink 50 is used (a decompression drying step). Thereafter, the ink is solidified by performing a firing treatment of heating under atmospheric pressure to, for example, 180° C. for 30 minutes, whereby the hole injection layer 131 is formed as shown in FIG. 5. The hole injection layer 131 is formed with a film thickness of about 10 nm to 30 nm, although not necessarily limited thereto in relation to the selection of the below-mentioned hole injection layer forming material or the other layers in the functional layer 136.

Subsequently, the hole transport layer 132 is formed using an ink 60 containing a hole transport layer forming material. The method for forming the hole transport layer 132 is also performed using an inkjet method (droplet ejection method) similarly to the hole injection layer 131. That is, a predetermined amount of the ink 60 is ejected as a droplet D from the nozzle 21 of the inkjet head 20 to the opening portion 106a. Then, the ink 60 applied to the opening portion 106a is dried under reduced pressure. Thereafter, a firing treatment of heating to, for example, 180° C. for 30 minutes in an inert gas environment such as nitrogen is performed, whereby the hole transport layer 132 is formed. The hole transport layer 132 is formed with a film thickness of about 10 nm to 20 nm, although not necessarily limited thereto in relation to the selection of the below-mentioned hole transport material or the other layers in the functional layer 136. Further, the hole injection layer 131 and the hole transport layer 132 may be combined to form a hole injection transport layer in relation to the other layers in the functional layer 136.

Subsequently, the light-emitting layer 133 is formed using an ink 70 containing a light-emitting layer forming material. The method for forming the light-emitting layer 133 is also performed using an inkjet method (droplet ejection method) similarly to the hole injection layer 131. That is, a predetermined amount of the ink 70 is ejected as a droplet D from the nozzle 21 of the inkjet head 20 to the opening portion 106a. Then, the ink 70 applied to the opening portion 106a is dried under reduced pressure. Thereafter, a firing treatment of heating to, for example, 130° C. for 30 minutes in an inert gas environment such as nitrogen is performed, whereby the light-emitting layer 133 is formed. The light-emitting layer 133 is formed with a film thickness of about 60 nm to 80 nm, although not necessarily limited thereto in relation to the selection of the below-mentioned light-emitting layer forming material or the other layers in the functional layer 136.

Subsequently, an electron transport layer 134 is formed by covering the light-emitting layer 133. An electron transport material constituting the electron transport layer 134 is not particularly limited, however, examples thereof include BAlq, 1,3,5-tri(5-(4-tert-butylphenyl)-1,3,4-oxadiazole) (OXD-1), BCP (Bathocuproine), 2-(4-biphenyl)-5-(4-tert-butylphenyl)-1,2,4-oxadiazole (PBD), 3-(4-biphenyl)-5-(4-tert-butylphenyl)-1,2,4-triazole (TAZ), 4,4'-bis(1,1-bis-diphenylethenyl)biphenyl (DPVBi), 2,5-bis(1-naphthyl)-1,3,4-oxadiazole (BND), 4,4'-bis(1,1-bis(4-methylphenyl)ethenyl)biphenyl (DPVBi), and 2,5-bis(4-biphenylyl)-1,3,4-oxadiazole (BBD) so that the electron transport layer 134 can be formed using a gas phase process such as a vacuum deposition method.

Additional examples thereof include tris(8-quinolinolato) aluminum (Alq3), oxadiazole derivatives, oxazole derivatives, phenanthroline derivatives, anthraquinodimethane derivatives, benzoquinone derivatives, naphthoquinone derivatives, anthraquinone derivatives, tetracyanoanthraquinodimethane derivatives, fluorene derivatives, diphenyldicyanoethylene derivatives, diphenoquinone derivatives, and hydroxyquinoline derivatives. Among these, it is possible to use one type or two or more types in combination.

The electron transport layer 134 is formed with a film thickness of about 20 nm to 40 nm, although not necessarily limited thereto in relation to the selection of the above-mentioned electron transport material or the other layers in the functional layer 136. According to this, electrons injected from the counter electrode 105 as a cathode can be preferably transported to the light-emitting layer 133. Incidentally, it is also possible to delete the electron transport layer 134 in relation to the other layers in the functional layer 136.

Subsequently, the electron injection layer 135 is formed by covering the electron transport layer 134. An electron injection material constituting the electron injection layer 135 is not particularly limited, however, examples thereof include alkali metal compounds and alkaline earth metal compounds so that the electron injection layer 135 can be formed using a gas phase process such as a vacuum deposition method.

Examples of the alkali metal compounds include alkali metal salts such as LiF, $Li_2CO_3$, LiCl, NaF, $Na_2CO_3$, NaCl, CsF, $Cs_2CO_3$, and CsCl. Examples of the alkaline earth metal compounds include alkaline earth metal salts such as $CaF_2$, $CaCO_3$, $SrF_2$, $SrCO_3$, $BaF_2$, and $BaCO_3$. Among these alkali metal compounds and alkaline earth metal compounds, it is possible to use one type or two or more types in combination.

The film thickness of the electron injection layer 135 is not particularly limited, but is preferably about 0.01 nm or more and 10 nm or less, more preferably about 0.1 nm or more and 5 nm or less. According to this, electrons can be efficiently injected from the counter electrode 105 as a cathode to the electron transport layer 134.

Subsequently, in the counter electrode formation step of Step S4, the counter electrode 105 is formed as a cathode by covering the electron injection layer 135. It is preferred to use a material with a low work function as the constituent material of the counter electrode 105, and, for example, Li, Mg, Ca, Sr, La, Ce, Er, Eu, Sc, Y, Yb, Ag, Cu, Al, Cs, Rb, Au, or an alloy containing any of these metals, or the like is used so that the counter electrode 105 can be formed using a gas phase process such as a vacuum deposition method, and, among these, it is possible to use one type or two or more types in combination (for example, a stacked body of a plurality of layers, or the like).

In particular, as in this embodiment, in the case where the organic EL device 100 is a top emission type device, it is preferred to use a metal such as Mg, Al, Ag, or Au, or an alloy such as MgAg, MgAl, MgAu, or AlAg as the constituent material of the counter electrode 105. It is possible to achieve the improvement of the electron injection efficiency and stability of the counter electrode 105 while maintaining the light transmission property of the counter electrode 105 by using such a metal or an alloy.

The film thickness of the counter electrode 105 in the top emission type device is not particularly limited, but is preferably about 1 nm or more and 50 nm or less, more preferably about 5 nm or more and 20 nm or less.

In the case where the organic EL device 100 is a bottom emission type device, a light transmission property is not required for the counter electrode 105. Therefore, for example, a metal or an alloy such as Al, Ag, AlAg, or AlNd is preferably used. By using such a metal or an alloy as the constituent material of the counter electrode 105, the electron injection efficiency and stability of the counter electrode 105 can be improved.

The film thickness of the counter electrode 105 in the bottom emission type device is not particularly limited, but is preferably about 50 nm or more and 1000 nm or less, more preferably about 100 nm or more and 500 nm or less.

As shown in FIG. 2, when, for example, moisture, oxygen, or the like enters from the outside, the light-emitting function in the functional layer 136 of the organic EL element 130 formed by the above production method is impaired, and the light emission brightness is partially lowered, or a dark point (dark spot) which does not emit light is generated. There is also a concern that the light-emitting life is shortened. Therefore, in order to protect the organic EL element 130 from the entry of moisture, oxygen, or the like, it is preferred to cover the organic EL element with a sealing layer (not shown). As the sealing layer, for example, an inorganic insulating material such as silicon oxynitride (SiON) with low permeability to water, oxygen, or the like can be used. Further, the organic EL element 130 may be sealed by, for example, attaching a sealing substrate such as a transparent glass to the element substrate 101 on which the organic EL element 130 is formed through an adhesive.

In the above-mentioned method for producing the organic EL element 130, the hole injection layer 131, the hole transport layer 132, and the light-emitting layer 133 in the functional layer 136 are formed by a liquid phase process (inkjet method), however, one of these layers may be formed by a liquid phase process (inkjet method), and the other layers may be formed by a gas phase process such as vacuum deposition.

Next, the constituent materials, which can be used in a liquid phase process or the gas phase process, of the hole injection layer 131, the hole transport layer 132, and the light-emitting layer 133 will be described.

Hole Injection Layer Forming Material and Hole Transport Layer Forming Material

Preferred hole injection or transport layer forming materials for forming the hole injection layer (HIL) 131 or the hole transport layer (HTL) 132 are not particularly limited, however, various types of p-type high-molecular materials and various types of p-type low-molecular materials can be used alone or in combination.

Examples of the p-type high-molecular materials (organic polymers) include aromatic amine-based compounds having an arylamine skeleton such as polyarylamines including poly(2,7-(9,9-di-n-octylfluorene)-(1,4-phenylene-((4-sec-butylphenyl)imino)-1,4-phenylene (TFB) and the like, polyfluorene derivatives (PF) having a fluorene skeleton such as a fluorene-bithiophene copolymer and polyfluorene derivatives (PF) having both of an arylamine skeleton and a fluorene skeleton such as a fluorene-arylamine copolymer, poly(N-vinylcarbazole) (PVK), polyvinyl pyrene, polyvinyl anthracene, polythiophene, polyalkylthiophene, polyhexylthiophene, poly(p-phenylene vinylene) (PPV), polythienylene vinylene, a pyrene formaldehyde resin, an ethylcarbazole formaldehyde resin and derivatives thereof, polysilane-based compounds such as polymethylphenylsilane (PMPS), poly[bis(4-phenyl) (2,4,6-trimethylphenyl) amine (PTTA), and poly[N,N'-bis(4-butylphenyl)-N,N'-bis(phenyl)-benzidine].

Such a p-type high-molecular material can also be used as a mixture with another compound. For example, as a mixture containing polythiophene, poly(3,4-ethylenedioxythiophene)/polystyrene sulfonic acid) (PEDOT/PSS), an electrically conductive polymer VERAZOL (registered trademark) manufactured by Soken Chemical & Engineering Co., Ltd. or the like, and ELsource (registered trademark) manufactured by Nissan Chemical Industries, Ltd. as polyaniline can be used.

Examples of the p-type low-molecular materials include arylcycloalkane-based compounds such as 1,1-bis(4-di-para-tolylaminophenyl)cyclohexane and 1,1'-bis(4-di-para-tolylaminophenyl)-4-phenyl-cyclohexane (TAPC), arylamine-based compounds such as 4,4',4''-trimethyltriphenylamine, N,N'-diphenyl-N,N'-bis(3-methylphenyl)-1,1'-biphenyl-4,4'-diamine (TPD), N,N,N',N'-tetraphenyl-1,1'-biphenyl-4,4'-diamine, N,N'-diphenyl-N,N'-bis(3-methylphenyl)-1,1'-biphenyl-4,4'-diamine (TPD1), N,N'-diphenyl-N,N'-bis(4-methoxyphenyl)-1,1'-biphenyl-4,4'-diamine (TPD2), N,N,N',N'-tetrakis(4-methoxyphenyl)-1,1'-biphenyl-4,4'-diamine (TPD3), N,N'-bis(1-naphthyl)-N,N'-diphenyl-1,1'-biphenyl-4,4'-diamine (α-NPD), a triphenylamine tetramer (TPTE), 1,3,5-tris[4-(diphenylamino)benzene (TDAPB), tris(4-(carbazol-9-yl)phenyl)amine (spiro-TAD), tris-p-tolylamine (HTM1), 1,1-bis[(di-4-tolylamino) phenyl]cyclohexane (HTM2), and N4,N4'-(biphenyl-4,4'-diyl)bis(N4,N4',N4'-triphenylbiphenyl-4,4'-diamine) (TPT1), phenylenediamine compounds such as N,N,N',N'-tetraphenyl-para-phenylenediamine, N,N,N',N'-tetra(para-tolyl)-para-phenylenediamine, N,N,N',N'-tetra(meta-tolyl)-meta-phenylenediamine (PDA), PDA-Si (Mol. Cryst. Liq. Cryst. Vol. 462. pp. 249-256, 2007), and N,N'-diphenyl-1,4-phenylenediamine (DPPD), carbazole-based compounds such as carbazole, N-isopropylcarbazole, N-phenylcarbazole, and VB-TCA (Adv. Mater. 2007, 19, 300-304), stilbene-based compounds such as stilbene and 4-di-para-tolylaminostilbene, oxazole-based compounds such as OxZ, triphenylmethane-based compounds such as triphenylmethane, 4,4',4''-tris[N-3-methylphenyl-N-phenylamino)triphenylamine (m-MTDATA), 4,4',4''-tris(N,N-(2-naphthyl)phenylamino)triphenylamine (2-TNATA), and 4,4',4''-tri(N-carbazolyl)triphenylamine (TCTA), pyrazoline-based compounds such as 1-phenyl-3-(para-dimethylaminophenyl)pyrazoline, benzine(cyclohexadiene)-based compounds, triazole-based compounds such as triazole, imidazole-based compounds such as imidazole, oxadiazole-based compounds such as 1,3,4-oxadiazole and 2,5-di(4-dimethylaminophenyl)-1,3,4-oxadiazole, anthracene-based compounds such as anthracene and 9-(4-diethylaminostyryl) anthracene, fluorenone-based compounds such as fluorenone, 2,4,7-trinitro-9-fluorenone, and 2,7-bis(2-hydroxy-3-(2-chlorophenylcarbamoyl)-1-naphthylazo)fluorenone, aniline-based compounds such as polyaniline, silane-based compounds, pyrrole-based compounds such as 1,4-dithioketo-3,6-diphenyl-pyrro-(3,4-c)pyrropyrrole, fluorene-based compounds such as fluorene, porphyrin-based compounds such as porphyrin and metal tetraphenyl porphyrins, quinacridone-based compounds such as quinacridone, metal or non-metal phthalocyanine-based compounds such as phthalocyanine, copper phthalocyanine (CuPc), tetra(t-butyl) copper phthalocyanine, and iron phthalocyanine, metal or non-metal naphthalocyanine-based compounds such as copper naphthalocyanine, vanadyl naphthalocyanine, and monochloro gallium naphthalocyanine, and benzidine-based compounds such as N,N'-di(naphthalen-1-yl)-N,N'-diphenyl-benzidine and N,N,N',N'-tetraphenylbenzidine. Incidentally, PDA-Si is used by adding a cationic polymerizable compound: xylene bisoxetane (ARONE OXETANE OXT-121, Toagosei Co., Ltd.) and a radical polymerization initiator: an aliphatic diacyl peroxide (PEROYL L, NOF Corporation) in order to achieve polymerization.

As a preferred solvent for PEDOT/PSS, water is used. As a solvent for other p-type high-molecular materials or low-molecular materials, an aromatic solvent such as toluene, xylene, or 3-phenoxytoluene (3-PT) is used.

Next, a light-emitting material (EML material) from which fluorescence or phosphorescence is obtained will be described by showing specific examples for each light emission color.

Red Light-Emitting Material

A red light-emitting material is not particularly limited, and various types of red fluorescent materials and red phosphorescent materials can be used alone or two or more types thereof can be used in combination.

The red fluorescent material is not particularly limited as long as it emits red fluorescence, and examples thereof include perylene derivatives, europium complexes, benzopyran derivatives, rhodamine derivatives, benzothioxanthene derivatives, porphyrin derivatives, nile red, 2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4H-ylidene)propanedinitrile (DCJTB), 4-(dicyanomethylene)-2-methyl-6-(p-dimethylaminostyryl)-4H-pyran (DCM), poly[2-methoxy-5-(2-ethylhexyloxy)-1,4-(1-cyanovinylenephenylene)], poly[{9,9-dihexyl-2,7-bis(1-cyanovinylene)fluorenylene}-ortho-co-{2,5-bis(N,N'-diphenylamino)-1,4-phenylene}], and poly[{2-methoxy-5-(2-ethylhexyloxy)-1,4-(1-cyanovinylenephenylene)}-co{2,5-bis(N,N'-diphenylamino)-1,4-phenylene}].

The red phosphorescent material is not particularly limited as long as it emits red phosphorescence, and examples thereof include metal complexes such as complexes of iridium, ruthenium, platinum, osmium, rhenium, and palladium, and metal complexes in which at least one of the ligands of such a metal complex has a phenylpyridine skeleton, a bipyridyl skeleton, a porphyrin skeleton or the like. More specific examples thereof include tris(1-phenylisoquinoline)iridium, bis[2-(2'-benzo[4,5-α]thienyl) pyridinato-N, C3']iridium (acetylacetonate) (Btp2Ir(acac)), 2,3,7,8,12,13,17,18-octaethyl-12H,23H-porphyrin-platinum (II), fac-tris(2-phenyl)-bis(2-(2'-benzo[4,5-α]thienyl)-pyridinato-N,C3')iridium (acetylacetonate) (Bt2Ir(acac)), and bis(2-phenylpyridine)iridium (acetylacetonate).

Further, the red light-emitting layer 133 may contain, in addition to the above-mentioned red light-emitting material, a host material to which the red light-emitting material is added as a guest material.

The host material has a function to generate an exciton by recombining a hole and an electron with each other, and also to excite the red light-emitting material by transferring the energy of the exciton to the red light-emitting material (Forster transfer or Dexter transfer). In the case where such a host material is used, for example, the red light-emitting material which is the guest material can be used by doping the host material with the red light-emitting material as a dopant.

Such a host material is not particularly limited as long as it has a function as described above for the red light-emitting material to be used, however, in the case where the red light-emitting material contains a red fluorescent material, examples thereof include acene derivatives (acene-based materials) such as naphthacene derivatives, naphthalene derivatives, and anthracene derivatives, distyrylarylene derivatives, perylene derivatives, distyrylbenzene derivatives, distyrylamine derivatives, quinolinolate-based metal complexes (BAql) such as tris(8-quinolinolato) aluminum complex (Alq3), triarylamine derivatives (TDAPB) such as triphenylamine tetramers, oxadiazole derivatives, silole derivatives (SimCP and UGH3), dicarbazole derivatives (CBP, mCP, CDBP, and DCB), oligothiophene derivatives, benzopyran derivatives, triazole derivatives, benzoxazole derivatives, benzothiazole derivatives, quinoline derivatives, and 4,4'-bis(2,2'-diphenylvinyl)biphenyl (DPVBi), and phosphorus derivatives (PO6). Among these, it is possible to use one type or two or more types in combination.

In the case where the red light-emitting material (guest material) and the host material as described above are used, the content (doping amount) of the red light-emitting material in the red light-emitting layer 133 is preferably from 0.01 wt % to 10 wt %, more preferably from 0.1 wt % to 5 wt %. By setting the content of the red light-emitting material within such a range, the light emission efficiency can be optimized.

Green Light-Emitting Material

A green light-emitting material is not particularly limited, and examples thereof include various types of green fluorescent materials and green phosphorescent materials, and among these, it is possible to use one type or two or more types in combination.

The green fluorescent material is not particularly limited as long as it emits green fluorescence, and examples thereof include coumarin derivatives, quinacridone and derivatives thereof, 9,10-bis[(9-ethyl-3-carbazole)-vinylenyl]-anthracene, poly(9,9-dihexyl-2,7-vinylenefluorenylene), poly[(9,9-dioctylfluorene-2,7-diyl)-co-(1,4-diphenylene-vinylene-2-methoxy-5-{2-ethylhexyloxy}benzene)], poly[(9,9-dioctyl-2,7-divinylenefluorenylene)-ortho-co-(2-methoxy-5-(2-ethoxylhexyloxy)-1,4-phenylene)], and poly[(9,9-dioctylfluorene-2,7-diyl)-ortho-co-(1,4-benzo-{2,1',3}-thiadiazole)] (F8BT).

The green phosphorescent material is not particularly limited as long as it emits green phosphorescence, and examples thereof include metal complexes such as complexes of iridium, ruthenium, platinum, osmium, rhenium, and palladium, and specific examples thereof include fac-tris(2-phenylpyridine) iridium (Ir(ppy)3), bis(2-phenylpyridinato-N,C2')iridium (acetylacetonate) (Ppy2Ir(acac)), and fac-tris[5-fluoro-2-(5-trifluoromethyl-2-pyridine)phenyl-C,N]iridium.

Further, the green light-emitting layer 133 may contain, in addition to the above-mentioned green light-emitting material, a host material to which the green light-emitting material is added as a guest material.

As such a host material, the same host materials as those described for the above-mentioned red light-emitting layer 133 can be used.

Blue Light-Emitting Material

Examples of a blue light-emitting material include various types of blue fluorescent materials and blue phosphorescent materials, and among these, it is possible to use one type or two or more types in combination.

The blue fluorescent material is not particularly limited as long as it emits blue fluorescence, and examples thereof include distyrylamine derivatives such as distyryldiamine-based compounds, fluoranthene derivatives, pyrene derivatives, perylene and perylene derivatives, anthracene derivatives, benzoxazole derivatives, benzothiazole derivatives, benzoimidazole derivatives, chrysene derivatives, phenanthrene derivatives, distyrylbenzene derivatives, tetraphenylbutadiene, and 4,4'-bis(9-ethyl-3-carbazovinylene)-1,1'-biphenyl (BCzVBi), poly[(9,9-dioctylfluorene-2,7-diyl)-co-(2,5-dimethoxybenzene-1,4-diyl)], poly[(9,9-dihexyloxyfluorene-2,7-diyl)-ortho-co-(2-methoxy-5-{2-ethoxylhexyloxy}phenylene-1,4-diyl)], poly[(9,9-dioctylfluorene-2,7-diyl)-co-(ethynylbenzene)], and poly[(9,9-dioctylfluorene-2,7-diyl)-co-(N,N'-diphenyl)-N,N'-di(para-butylphenyl)-1,4-diamino-benzene]].

The blue phosphorescent material is not particularly limited as long as it emits blue phosphorescence, and examples thereof include metal complexes such as complexes of iridium, ruthenium, platinum, osmium, rhenium, and palladium, and specific examples thereof include bis[4,6-difluorophenylpyridinato-N,C2']-picolinate-iridium (FIrpic), tris (1-phenyl-3-methylbenzimidazolin-2-ylidene-C,C2') (Ir(pmb)3), bis(2,4-difluorophenylpyridinato) (5-(pyridin-2-yl)-1H-tetrazole)iridium (FIrN4), tris[2-(2,4-difluorophenyl)pyridinato-N,C2']iridium, bis[2-(3,5-trifluoromethyl)pyridinato-N,C2']-picolinate-iridium, and bis(4,6-difluorophenylpyridinato-N,C2')iridium (acetylacetonate).

Further, the blue light-emitting layer 133 may contain, in addition to the above-mentioned blue light-emitting material, a host material to which the blue light-emitting material is added as a guest material.

As such a host material, the same host materials as those described for the above-mentioned red light-emitting layer 133 can be used.

In this embodiment, the low molecular weight refers to that the average molecular weight is less than 1000, and the high molecular weight refers to that the average molecular weight is 1000 or more and the molecule has a repeated structure of a basic skeleton. Examples of a preferred solvent for these light-emitting layer forming materials include aromatic solvents such as toluene, xylene, and 3-phenoxytoluene (3-PT).

Figure 6:
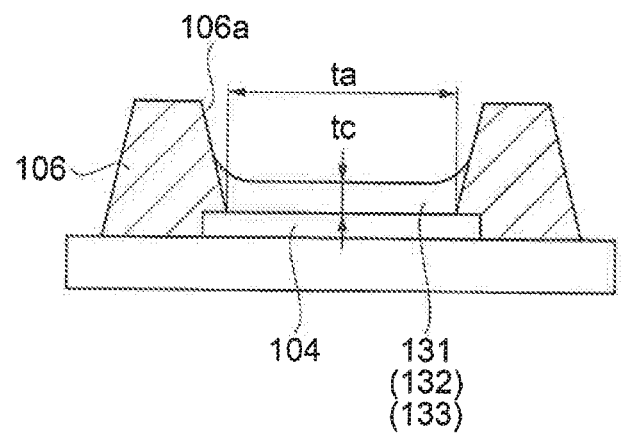
FIG. 6 is a schematic cross-sectional view showing a film thickness of a central portion of a pixel in a functional layer.

FIG. 6 is a schematic cross-sectional view showing the film thickness of a central portion of a pixel in the functional layer. In an inkjet method, the film thickness and the flatness of the formed functional layer are ensured by accurately ejecting a predetermined amount of the ink to the opening portion 106a surrounded by the partition wall 106 as described above. The film thickness unevenness of the functional layer affects the light emission unevenness or the light emission life in the organic EL element 130. In particular, when the ink is applied to the opening portion 106a and dried, the pinning position (film fixed position) where the film formation is started on the side wall of the partition wall 106 varies depending on whether the solid component contained in the ink is a high-molecular material or a low-molecular material, and it is considered that this affects the film flatness after drying.

As shown in FIG. 6, the film thickness in a central portion of the pixel electrode 104 of the formed film is referred to as "intra-pixel central film thickness tc", and the average of the film thickness in a range in contact with the pixel electrode 104 is referred to as "intra-pixel average film thickness ta". These film thicknesses can be measured by, for example, a probe-type measurement device. The shape of the cross section of the film after forming is swollen or dented in a central portion of the pixel according to the progress of drying of the ink applied to the opening portion 106a or the above-mentioned pinning position. That is, the intra-pixel central film thickness tc varies. Also the variation in the total ejection amount of the ink ejected to the opening portion 106a affects the progress of drying of the ink or the above-mentioned pinning position. Therefore, it is demanded that a predetermined amount of the ink be accurately ejected (applied) to the opening portion 106a.

Droplet Ejection State

Figure 7:
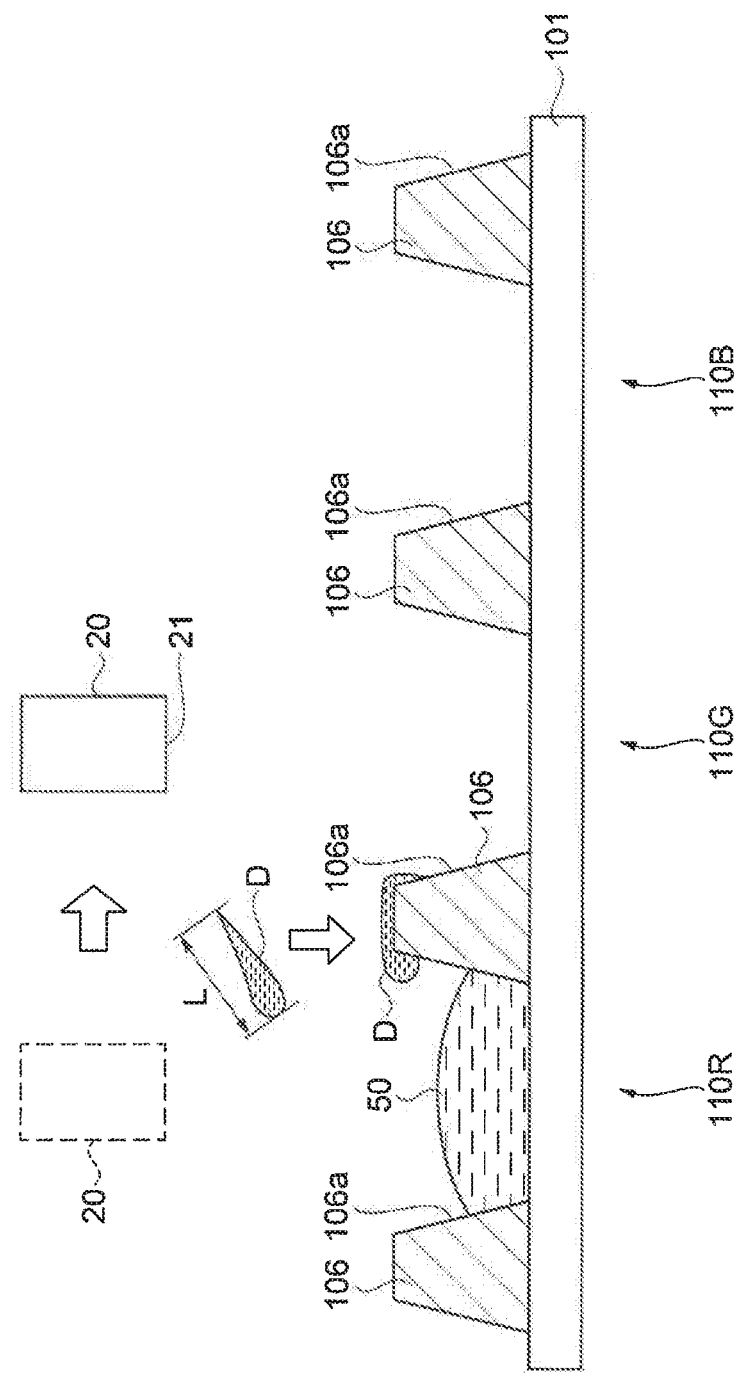
FIG. 7 is a schematic view showing a droplet ejection state in an opening portion.

FIG. 7 is a schematic view showing a droplet ejection state in the opening portion. As shown in FIG. 7, by forming the partition walls 106, a plurality of opening portions 106a corresponding to the respective sub-pixels 110R, 110G, and 110B are provided on the element substrate 101. In an inkjet method, the element substrate 101 and the inkjet head 20 are disposed facing each other with a predetermined space, and while performing scanning by relatively moving the inkjet head 20 in a fixed direction with respect to the plurality of opening portions 106a on the element substrate 101, for example, the ink 50 is ejected as a droplet D to land on the opening portion 106a from the nozzle 21 at a predetermined timing. The droplet D is ejected from the nozzle 21 with a tail left behind by applying pressure to a cavity filled with the ink 50 by the driving element, and pushing out and separating the ink 50 from the nozzle 21 communicating with the cavity in the form of a droplet D. The inkjet head 20 is relatively moved by the scanning, and therefore, the droplet D is affected by the relative movement, and a rear end portion of the tail lands on the opening portion 106a later than a tip end portion of the droplet D, and therefore, the landing position of the tip end portion of the droplet D and the landing position of the rear end portion are different. Since the rear end portion of the droplet D lands later, when the length L of the droplet D is longer than a predetermined value, as shown in FIG. 7, the rear end portion of the droplet D lands on another opening portion 106a adjacent in the scanning direction to the opening portion 106a on which the droplet D should land originally, that is, the ink 50 may leak and land on the adjacent opening portion 106a. Therefore, in order to accurately apply a predetermined amount of the ink 50 to the opening portion 106a, it is necessary to reliably place the droplet D with a tail left behind in the opening portion 106a. The length L of the droplet D including the tail is defined mainly by the ejection amount and ejection velocity of the droplet D. The ejection amount and ejection velocity of the droplet D can be controlled by the driving conditions for the driving element provided for each nozzle 21 of the inkjet head 20. The inkjet head 20 of this embodiment is called "Mach head" manufactured by Seiko Epson Corporation, and includes a piezoelectric element as the driving element. Further, the diameter of the nozzle 21 is about 27 µm.

In this embodiment, the predetermined distance between the nozzle surface on which the nozzle 21 is provided of the inkjet head 20 and the element substrate 101 is about 300 µm. As described above, a plurality of droplets D are ejected to the opening portion 106a and the ink 50 therein rounds up, and therefore, the distance between the surface of the ink 50 in the opening portion 106a and the nozzle surface is decreased to less than 300 µm. When the droplet D is ejected from the nozzle 21 while performing scanning with the inkjet head 20 with respect to the element substrate 101, if the droplet D comes in contact with the ink 50 in the opening portion 106a, the ejection of the droplet D becomes unstable, and therefore, the length L of the droplet D is less than 300 µm, and is preferably 250 µm or less. Incidentally, the length L of the droplet D is the length of the droplet immediately after the ink is separated from the nozzle surface.

Driving Waveform for Piezoelectric Element

Figure 8:
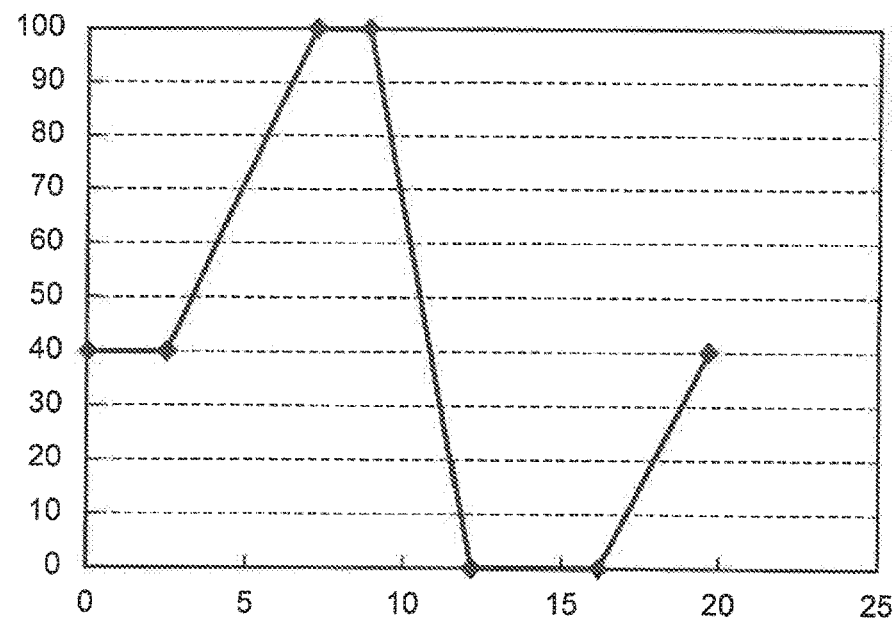
FIG. 8 is a view showing one example of a driving waveform to be applied to a piezoelectric element of an inkjet head.

FIG. 8 is a view showing one example of a driving waveform to be applied to the piezoelectric element of the inkjet head. In FIG. 8, the vertical axis represents a driving voltage level when the maximum driving voltage is taken as "100", and the horizontal axis represents a time axis when one cycle of the driving waveform is taken as "20". The driving waveform to be applied to the piezoelectric element in this embodiment is called "push-pull waveform". Specifically, as shown in FIG. 8, in the driving waveform, the reference voltage level is set to "40", and the voltage is increased from the reference voltage level of "40" to the maximum voltage level of "100", and thereafter maintained for a fixed time (push waveform). Thereafter, the voltage is decreased from the maximum voltage level of "100" to the minimum voltage level of "0" and maintained for a fixed time, and thereafter returned to the reference voltage level of "40" (pull waveform). A cycle in which the voltage level starts from "40" and returns to "40" again is one cycle of the driving waveform. The driving voltage described hereinafter is defined as a difference between the maximum voltage level and the minimum voltage level.

In such a driving waveform, as the maximum voltage level is increased, the change in the volume of the cavity is increased and the ejection amount and ejection velocity of the droplet D are increased. The length L of the droplet D is considered to depend on the ejection amount and ejection velocity, but is also affected by the time when the voltage level is changed in the above driving waveform. For example, if the time when the voltage level is changed from "40" to "100" or the time when the voltage level is changed from "100" to "40" is shortened, the volume of the cavity is rapidly changed, and the ejection velocity is increased, and thus, the length L of the droplet D is increased.

Ink

The ink of this embodiment satisfies the condition that the length L of the droplet D including the tail is 250 µm (micrometer) or less when the range of the ejection amount (ejection weight (Iw)) of the droplet D is set to 9.5 ng or more and 11.0 ng or less and the range of the ejection velocity (Vm) is set to 6 m/s (sec) or more and 9 m/s (sec) or less at the time of ejecting the ink as the droplet D from the nozzle 21 of the inkjet head 20. According to this, ejection stability and landing performance (the performance that the ink lands on the target opening portion) are realized.

Further, the ink of this embodiment satisfies the condition that the range of the driving voltage (a difference between the maximum voltage level and the minimum voltage level) to be applied to the piezoelectric element when the ejection amount (ejection weight (Iw)) of the droplet D is set to 10 ng is 15 V or more and 32 V or less. By setting the range of the driving voltage to 15 V or more and 32 V or less, the droplet D can be ejected in a stable ejection amount from the nozzle 21. Specifically, in the case where the piezoelectric element is driven at a low driving voltage of less than 15 V, it is difficult to eject the droplet D in a stable ejection amount from the nozzle 21, and the droplet D may not be ejected from the nozzle 21. On the other hand, in the case where the piezoelectric element is driven at a high driving voltage exceeding 32 V, the physical properties of the ink may be changed by the heat emitted from the piezoelectric element to cause a variation in the ejection amount. That is, the driving voltage is preferably 15 V or more and 32 V or less. Further, the inkjet head 20 includes a plurality of nozzles 21, and therefore, in consideration of a variation in the ejection amount among the nozzles 21 and a variation in the length L of the droplet D caused by the variation in the ejection amount, it is more preferred that the driving voltage to be applied to the piezoelectric element when the ejection amount (ejection weight (Iw)) is set to 10 ng is 23 V or less.

EXAMPLES AND COMPARATIVE EXAMPLES OF Ink

Hereinafter, by showing Examples and Comparative Examples of the ink, the ejection characteristics thereof and the length of the droplet D will be described with reference to FIGS. 9 to 34.

Example 1

The ink of Example 1 is an ink containing a hole injection layer forming material, and has a solid component concentration of 1.3 wt % and contains 3-PT as a good solvent for the solid component. The viscosity of the ink is adjusted to 3.6 cP (centipoise). The frequency of the driving waveform shown in FIG. 8 is set to 30 kHz.

Figure 9:
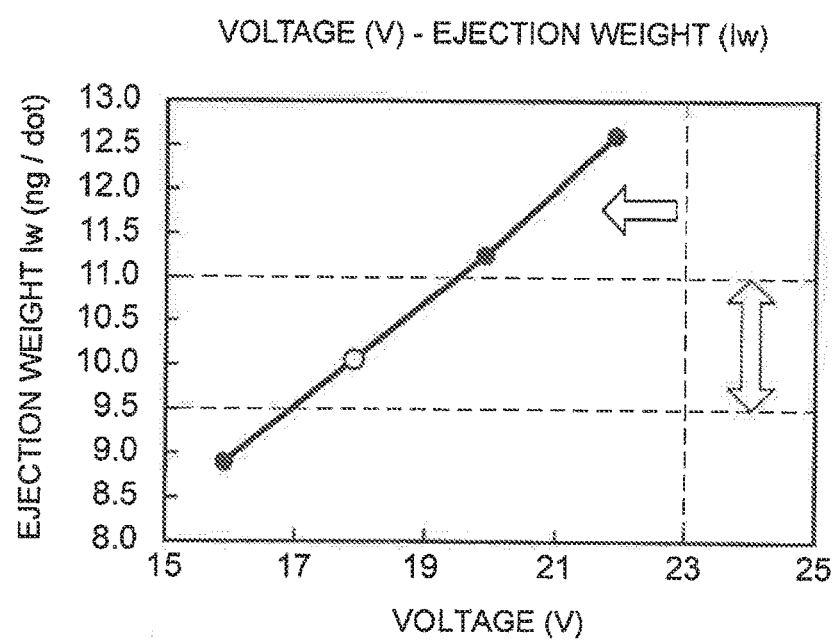
FIG. 9 is a graph showing a relationship between a driving voltage and an ejection weight (Iw) for an ink of Example 1.
Figure 10:
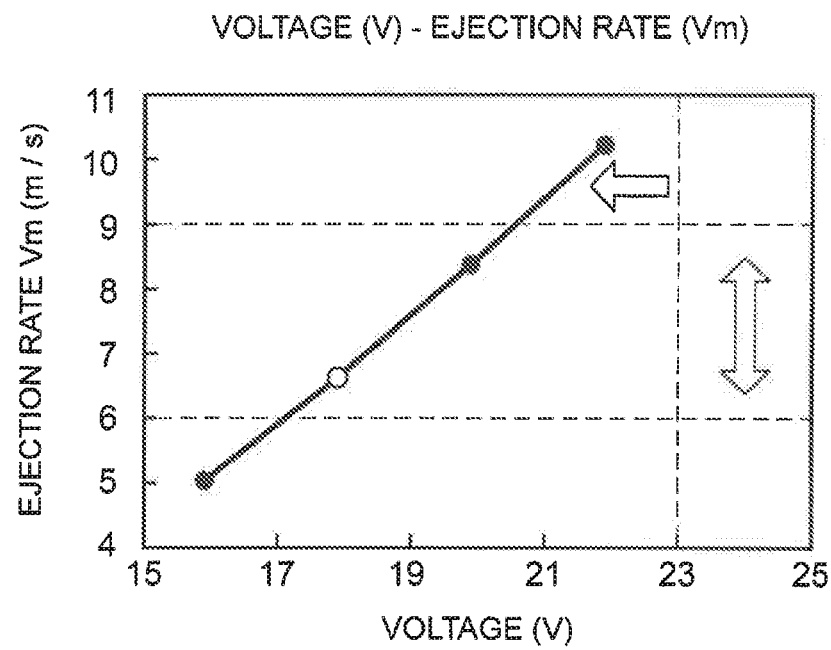
FIG. 10 is a graph showing a relationship between a driving voltage and an ejection velocity (Vm) for the ink of Example 1.
Figure 11:
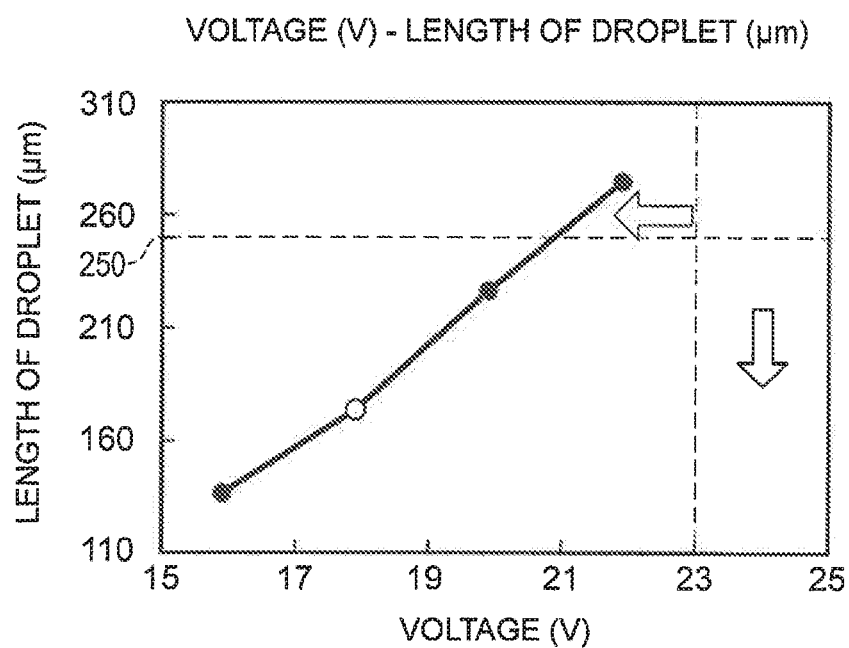
FIG. 11 is a graph showing a relationship between a driving voltage and the length of a droplet for the ink of Example 1.
Figure 12:
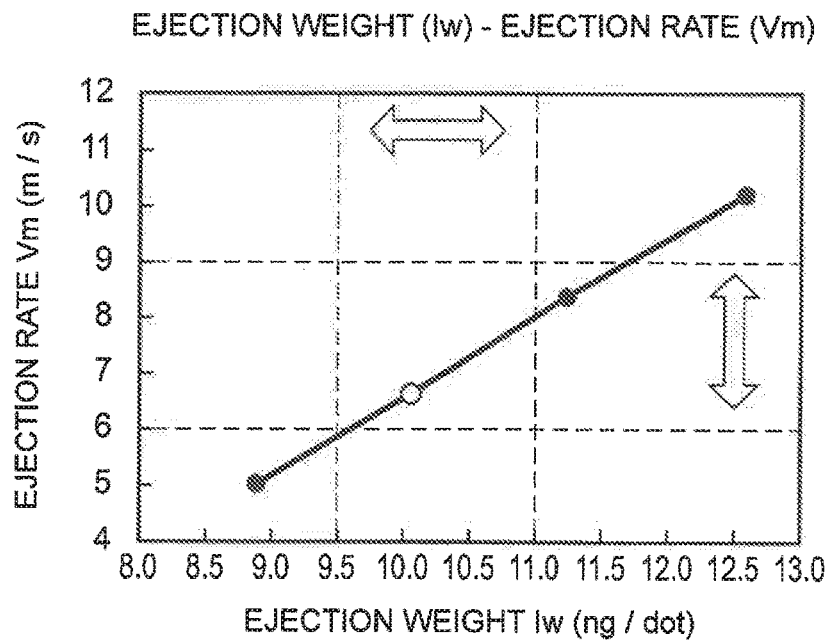
FIG. 12 is a graph showing a relationship between an ejection weight (Iw) and an ejection velocity (Vm) for the ink of Example 1.
Figure 13:
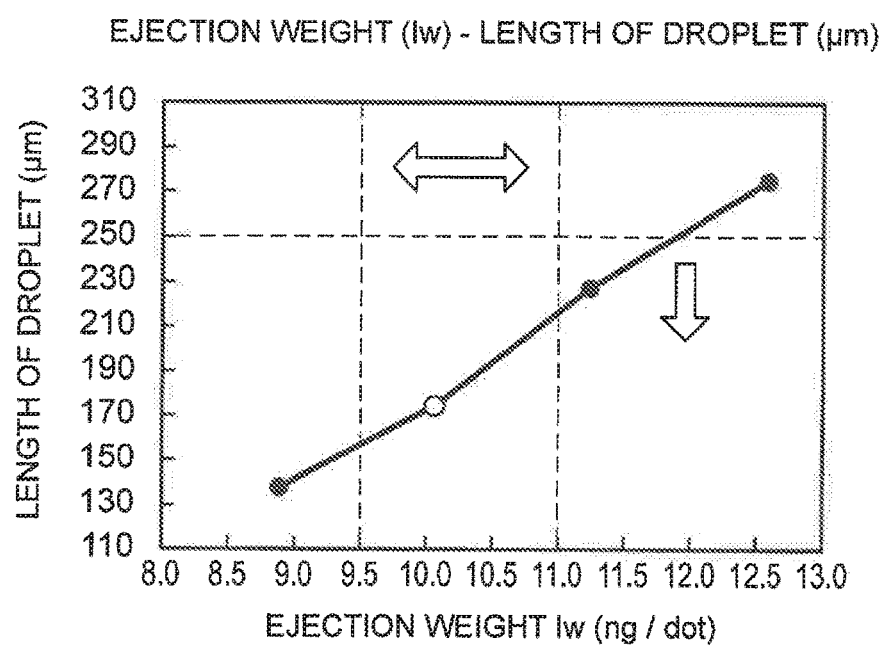
FIG. 13 is a graph showing a relationship between an ejection weight (Iw) and the length of a droplet for the ink of Example 1.

FIG. 9 is a graph showing a relationship between the driving voltage and the ejection weight (Iw) for the ink of Example 1. FIG. 10 is a graph showing a relationship between the driving voltage and the ejection velocity (Vm) for the ink of Example 1. FIG. 11 is a graph showing a relationship between the driving voltage and the length of the droplet for the ink of Example 1. FIG. 12 is a graph showing a relationship between the ejection weight (Iw) and the ejection velocity (Vm) for the ink of Example 1. FIG. 13 is a graph showing a relationship between the ejection weight (Iw) and the length of the droplet for the ink of Example 1. The open circle in each graph indicates that the ejection weight (Iw) is 10 ng.

It is difficult to measure the weight of one droplet of picoliter order, and therefore, in this embodiment, the ejection weight (Iw) of the droplet D is determined by measuring the total weight of the ink when several thousands to several ten thousands of droplets D are ejected using, for example, an electronic balance or the like, and dividing the total weight of the ink by the number of droplets. Further, the ejection velocity (Vm) or the length of the droplet D is determined by taking an image of the ejected droplet D by high-speed photography and analyzing the taken image.

As shown in FIG. 9, the ejection amount (ejection weight (Iw)) of the ink of Example 1 can be controlled to 9.5 ng or more and 11.0 ng or less at a driving voltage in the range of 17 V or more and 19.5 V or less. Similarly, as shown in FIG. 10, the ejection velocity (Vm) can be controlled to 6 m/s (sec) or more and 9 m/s (sec) or less at a driving voltage in the range of 17 V or more and 20.5 V or less. Further, as shown in FIG. 11, the length of the droplet can be controlled to 250 μm or less by setting the driving voltage to 21 V or less. Further, the driving voltage when the ejection amount (ejection weight (Iw)) is 10 ng is about 18 V. Therefore, as shown in FIGS. 12 and 13, by setting the ejection amount (ejection weight (Iw)) to 9.5 ng or more and 11 ng or less and by setting the ejection velocity (Vm) to 6 m/s or more and 9 m/s or less, the length of the droplet becomes about 220 μm or less.

Example 2

The ink of Example 2 is an ink containing a hole transport layer forming material, and has a solid component concentration of 0.5 wt % and contains 3-PT as a good solvent for the solid component. The viscosity of the ink is adjusted to 8.1 cP (centipoise). The frequency of the driving waveform is set to 30 kHz. In addition, with respect to Example 1, the reference voltage level of the driving waveform is set to "30". This is because the viscosity of the ink of Example 2 is higher than that of the ink of Example 1, and therefore, in response to this, the reference voltage level is decreased while maintaining the maximum voltage level of the driving waveform, and the voltage level of the push waveform is virtually increased.

Figure 14:
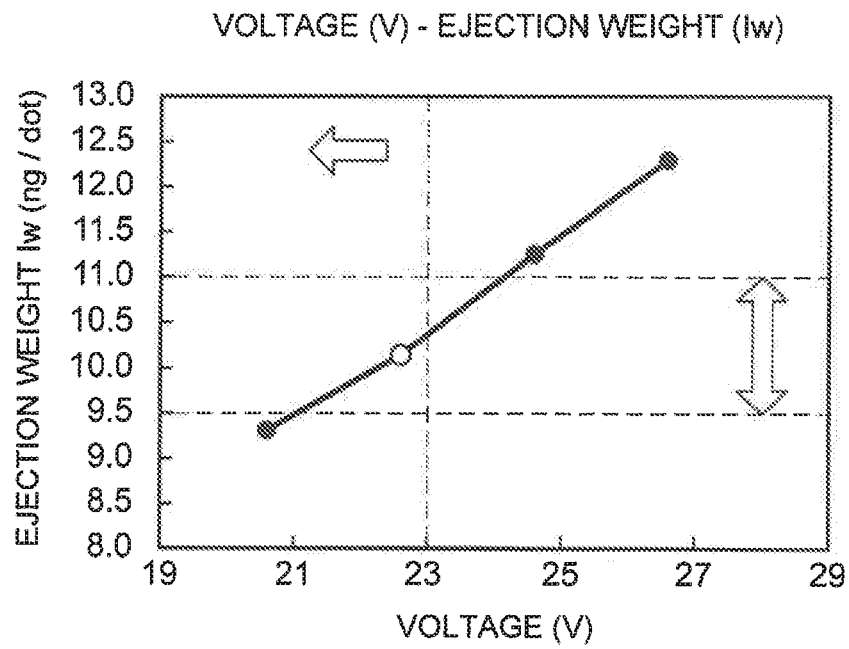
FIG. 14 is a graph showing a relationship between a driving voltage and an ejection weight (Iw) for an ink of Example 2.
Figure 15:
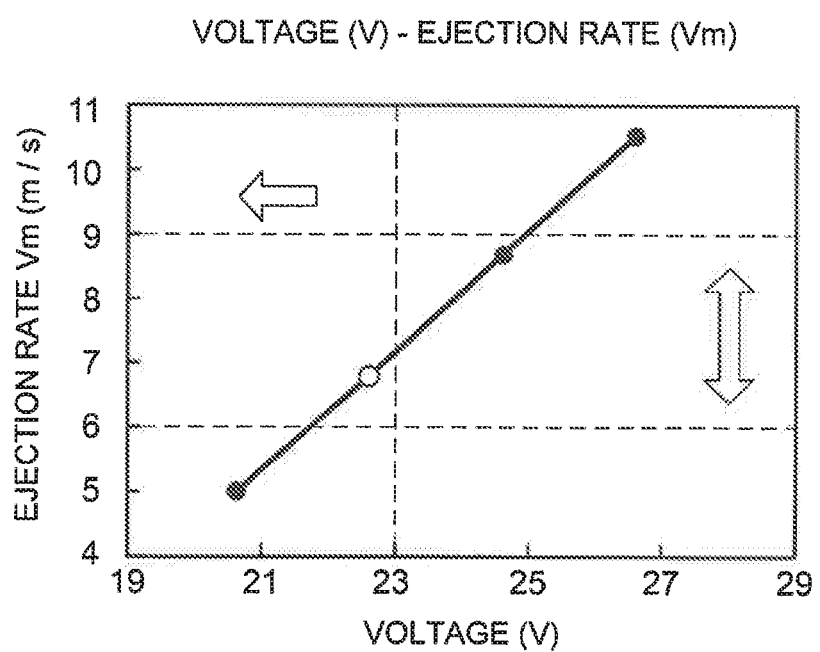
FIG. 15 is a graph showing a relationship between a driving voltage and an ejection velocity (Vm) for the ink of Example 2.
Figure 16:
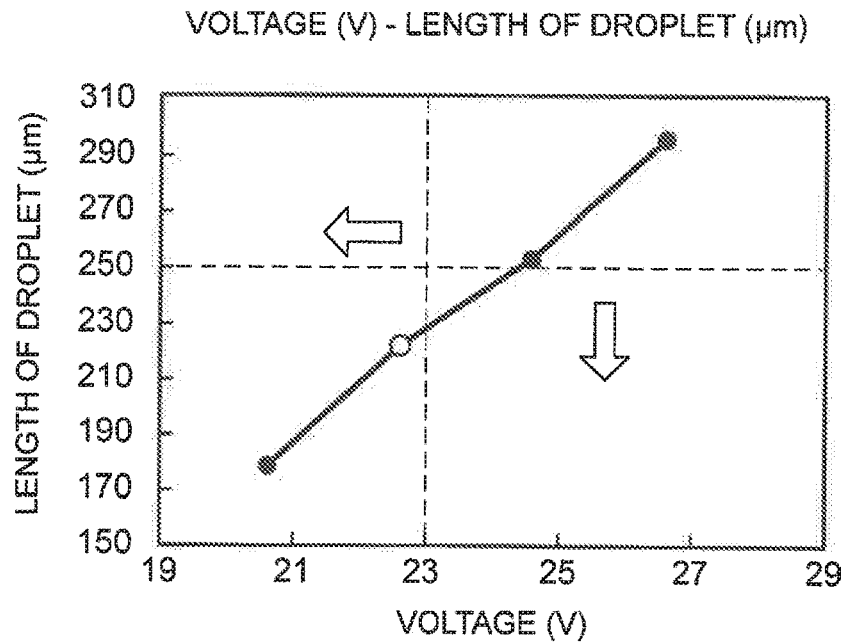
FIG. 16 is a graph showing a relationship between a driving voltage and the length of a droplet for the ink of Example 2.
Figure 17:
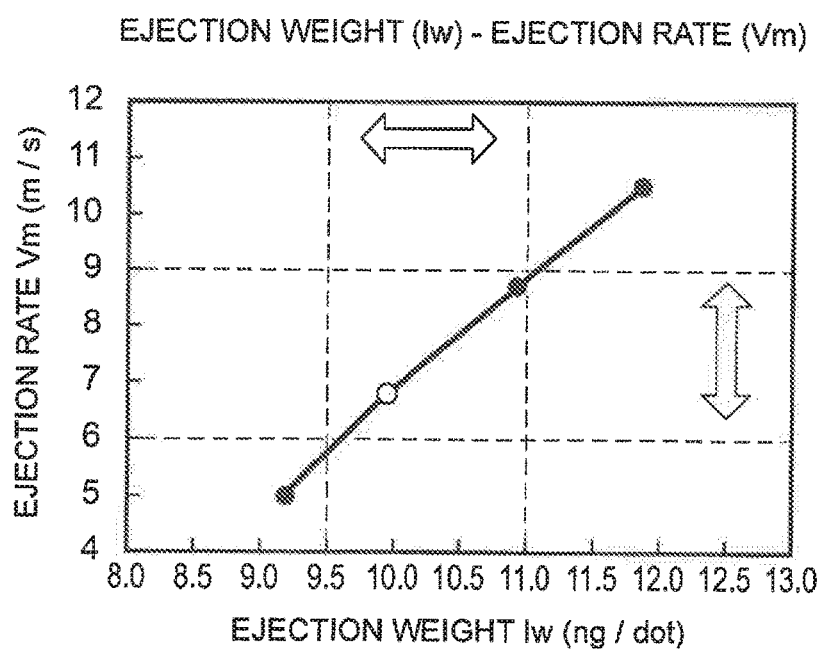
FIG. 17 is a graph showing a relationship between an ejection weight (Iw) and an ejection velocity (Vm) for the ink of Example 2.
Figure 18:
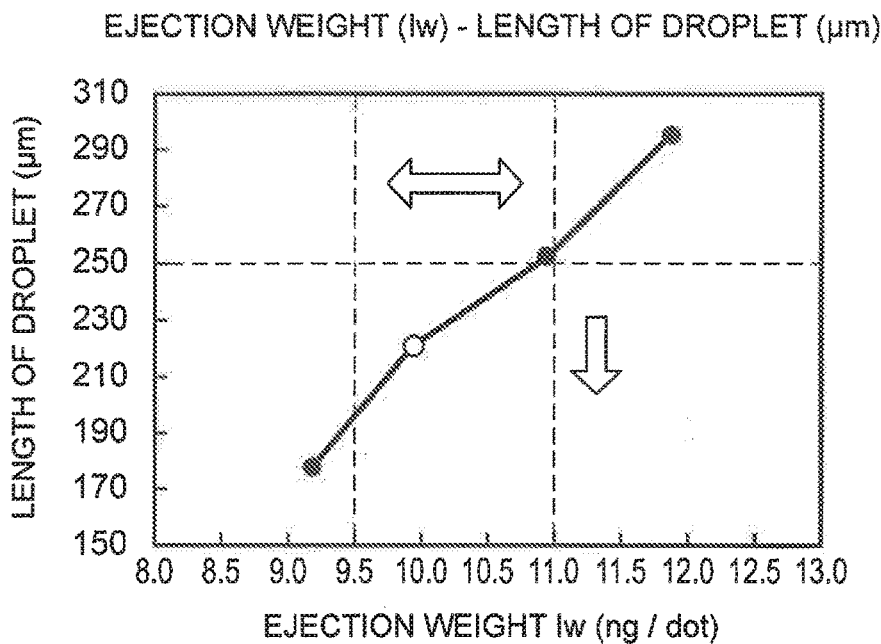

FIG. 14 is a graph showing a relationship between the driving voltage and the ejection weight (Iw) for the ink of Example 2. FIG. 15 is a graph showing a relationship between the driving voltage and the ejection velocity (Vm) for the ink of Example 2. FIG. 16 is a graph showing a relationship between the driving voltage and the length of the droplet for the ink of Example 2. FIG. 17 is a graph showing a relationship between the ejection weight (Iw) and the ejection velocity (Vm) for the ink of Example 2. FIG. 18 is a graph showing a relationship between the ejection weight (Iw) and the length of the droplet for the ink of Example 2.

As shown in FIG. 14, the ejection amount (ejection weight (Iw)) of the ink of Example 2 can be controlled to 9.5 ng or more and 11.0 ng or less at a driving voltage in the range of 21 V or more and 24.5 V or less. Similarly, as shown in FIG. 15, the ejection velocity can be controlled to 6 m/s or more and 9 m/s or less at a driving voltage in the range of 22 V or more and 25 V or less. Further, as shown in FIG. 16, the length of the droplet can be controlled to 250 μm or less by setting the driving voltage to 24.5 V or less. Further, the driving voltage when the ejection amount (ejection weight (Iw)) is 10 ng is about 22.5 V. Therefore, as shown in FIGS. 17 and 18, by setting the ejection amount (ejection weight (Iw)) to 9.5 ng or more and 11 ng or less and by setting the ejection velocity (Vm) to 6 m/s or more and 9 m/s or less, the length of the droplet becomes about 250 μm or less.

Example 3

The ink of Example 3 is an ink containing a light-emitting layer forming material from which green light emission is obtained, and has a solid component concentration of 1.6 wt % and contains 3-PT as a good solvent for the solid component. The viscosity of the ink is adjusted to 6.2 cP (centipoise). The frequency of the driving waveform is set to 30 kHz. In addition, in the same manner as in Example 2, the reference voltage level of the driving waveform is set to "30". This is because the viscosity of the ink of Example 3 is higher than that of the ink of Example 1, and therefore, in response to this, the reference voltage level is decreased while maintaining the maximum voltage level of the driving waveform, and the voltage level of the push waveform is virtually increased.

Figure 19:
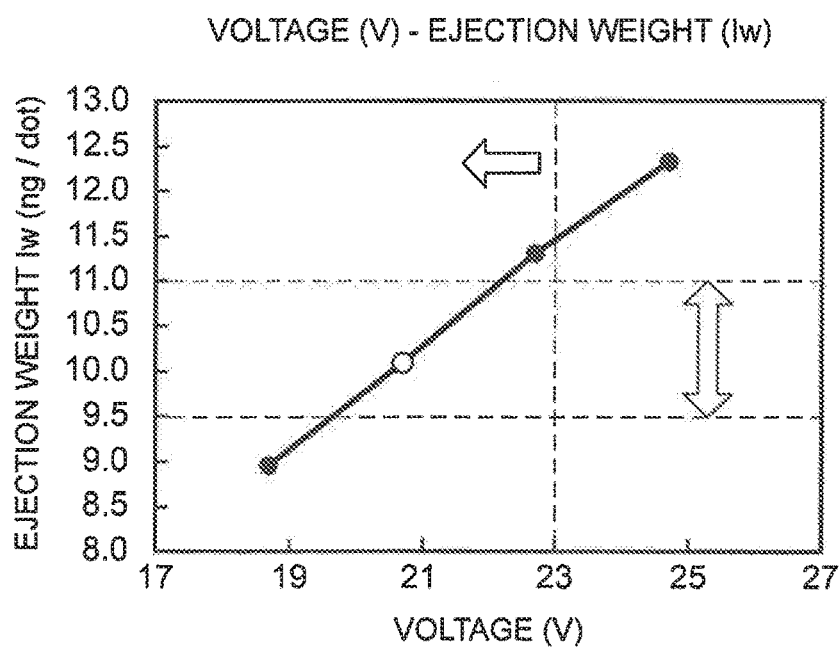
FIG. 19 is a graph showing a relationship between a driving voltage and an ejection weight (Iw) for an ink of Example 3.
Figure 20:
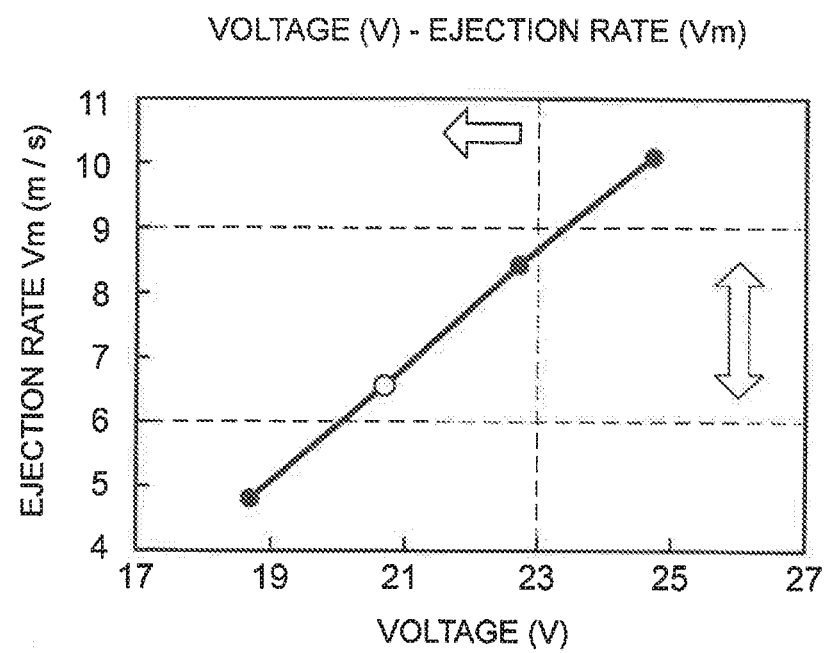
FIG. 20 is a graph showing a relationship between a driving voltage and an ejection velocity (Vm) for the ink of Example 3.
Figure 21:
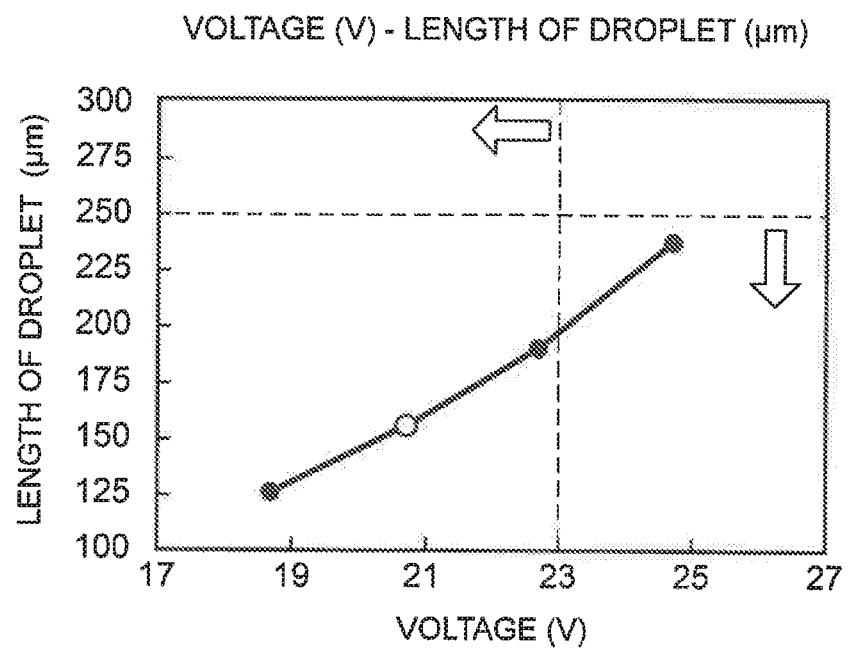
FIG. 21 is a graph showing a relationship between a driving voltage and the length of a droplet for the ink of Example 3.
Figure 22:
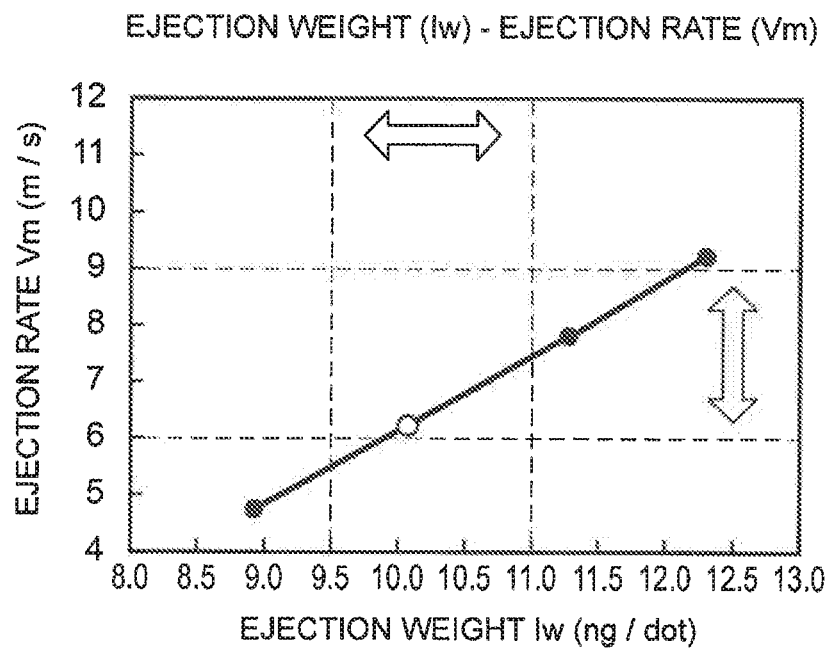
FIG. 22 is a graph showing a relationship between an ejection weight (Iw) and an ejection velocity (Vm) for the ink of Example 3.
Figure 23:
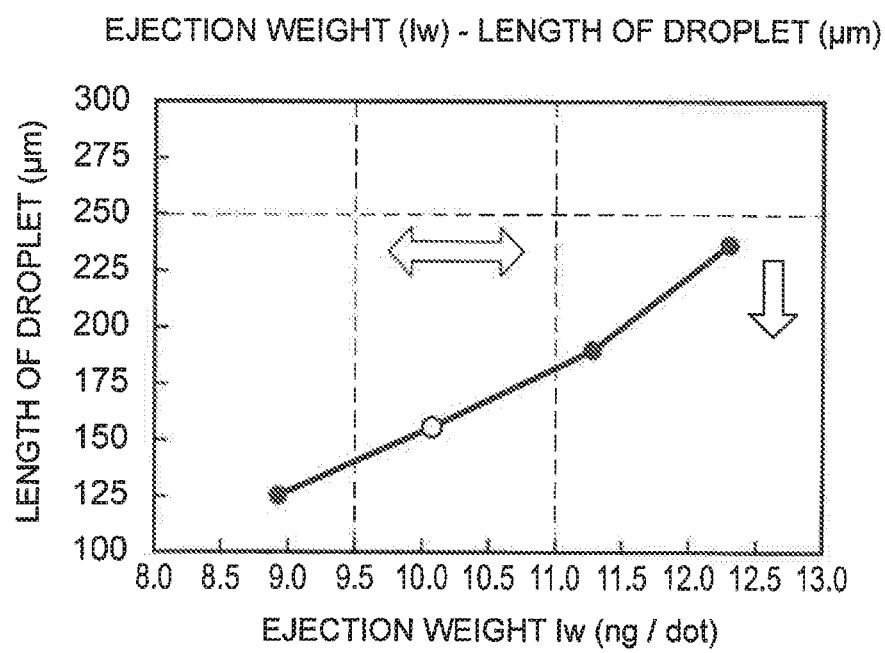
FIG. 23 is a graph showing a relationship between an ejection weight (Iw) and the length of a droplet for the ink of Example 3.

FIG. 19 is a graph showing a relationship between the driving voltage and the ejection weight (Iw) for the ink of Example 3. FIG. 20 is a graph showing a relationship between the driving voltage and the ejection velocity (Vm) for the ink of Example 3. FIG. 21 is a graph showing a relationship between the driving voltage and the length of the droplet for the ink of Example 3. FIG. 22 is a graph showing a relationship between the ejection weight (Iw) and the ejection velocity (Vm) for the ink of Example 3. FIG. 23 is a graph showing a relationship between the ejection weight (Iw) and the length of the droplet for the ink of Example 3.

As shown in FIG. 19, the ejection amount (ejection weight (Iw)) of the ink of Example 3 can be controlled to 9.5 ng or more and 11.0 ng or less at a driving voltage in the range of 20 V or more and 22.5 V or less. Similarly, as shown in FIG. 20, the ejection velocity (Vm) can be controlled to 6 m/s or more and 9 m/s or less at a driving voltage in the range of 20.5 V or more and 23.5 V or less. Further, as shown in FIG. 21, the length of the droplet can be controlled to 250 μm or less by setting the driving voltage to 25 V or less. Further, the driving voltage when the ejection amount (ejection weight (Iw)) is 10 ng is about 20.5 V. Therefore, as shown in FIGS. 22 and 23, by setting the ejection amount (ejection weight (Iw)) to 9.5 ng or more and 11 ng or less and by setting the ejection velocity (Vm) to 6 m/s or more and 9 m/s or less, the length of the droplet becomes about 180 μm or less.

Comparative Example 1

The ink of Comparative Example 1 is an ink containing a light-emitting layer forming material from which blue light emission is obtained, and has a solid component concentration of 2.0 wt % and contains 3-PT as a good solvent for the solid component. The viscosity of the ink is about 15 cP (centipoise). The frequency of the driving waveform is set to 30 kHz. In addition, also in Comparative Example 1, the reference voltage level of the driving waveform is set to "30". This is because the viscosity of the ink of Comparative Example 1 is higher than that of the ink of Example 1, and therefore, in response to this, the reference voltage level is decreased while maintaining the maximum voltage level of the driving waveform, and the voltage level of the push waveform is virtually increased.

Figure 24:
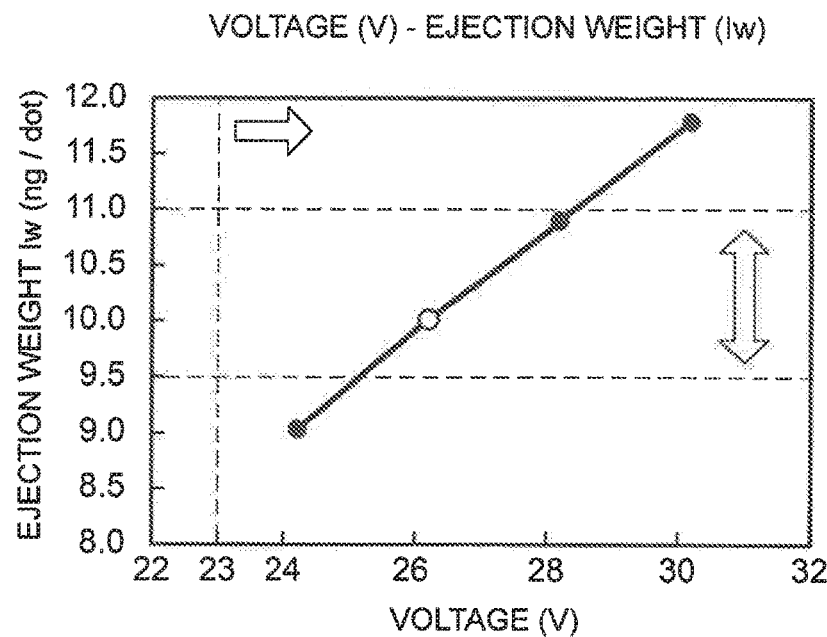
FIG. 24 is a graph showing a relationship between a driving voltage and an ejection weight (Iw) for an ink of Comparative Example 1.
Figure 25:
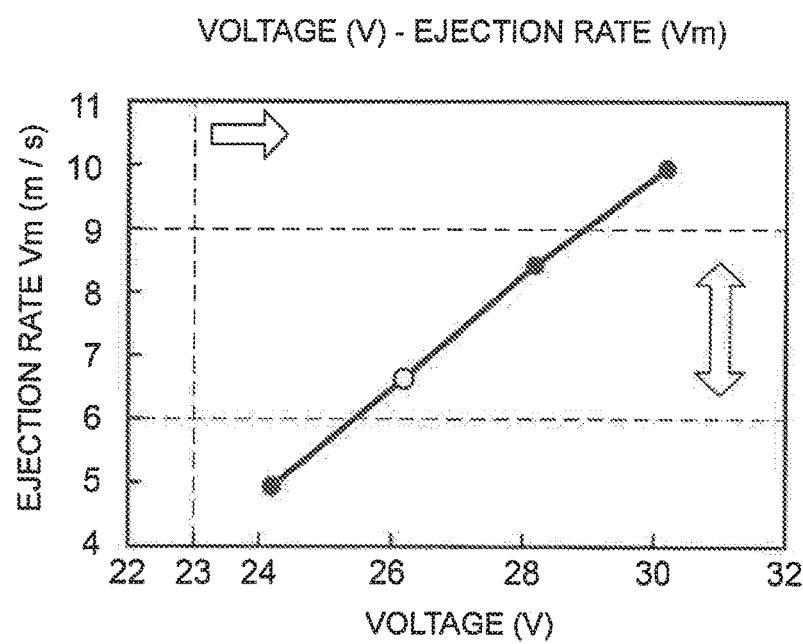
FIG. 25 is a graph showing a relationship between a driving voltage and an ejection velocity (Vm) for the ink of Comparative Example 1.
Figure 26:
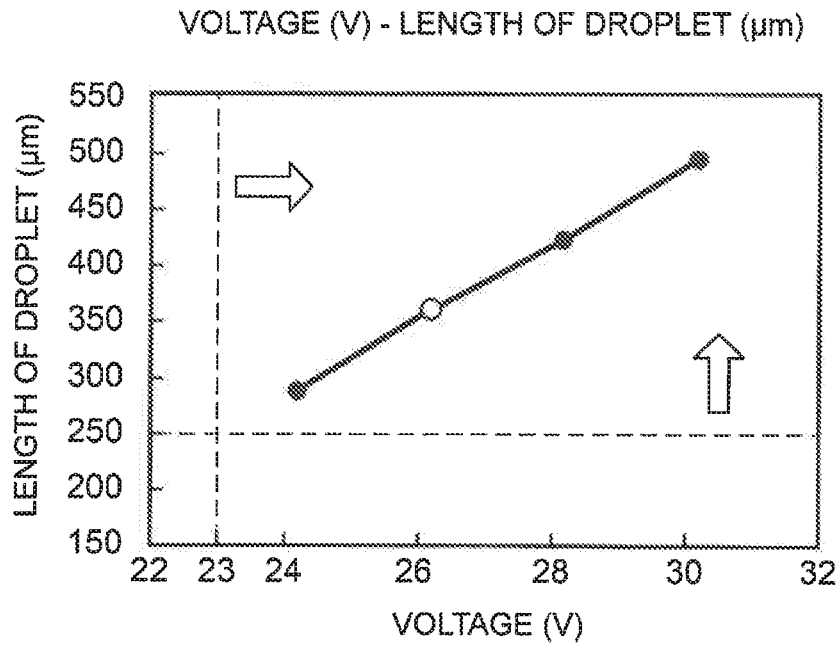
FIG. 26 is a graph showing a relationship between a driving voltage and the length of a droplet for the ink of Comparative Example 1.
Figure 27:
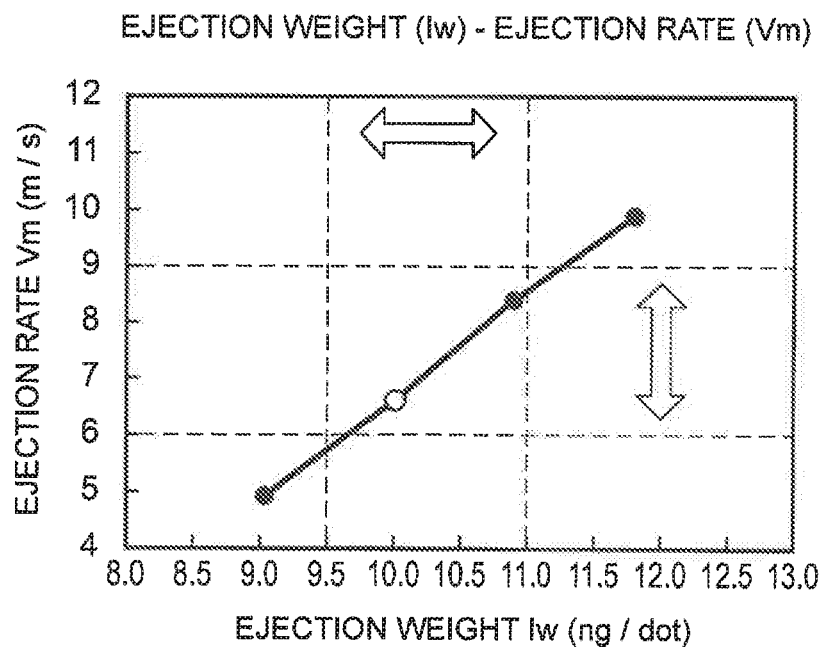
FIG. 27 is a graph showing a relationship between an ejection weight (Iw) and an ejection velocity (Vm) for the ink of Comparative Example 1.
Figure 28:
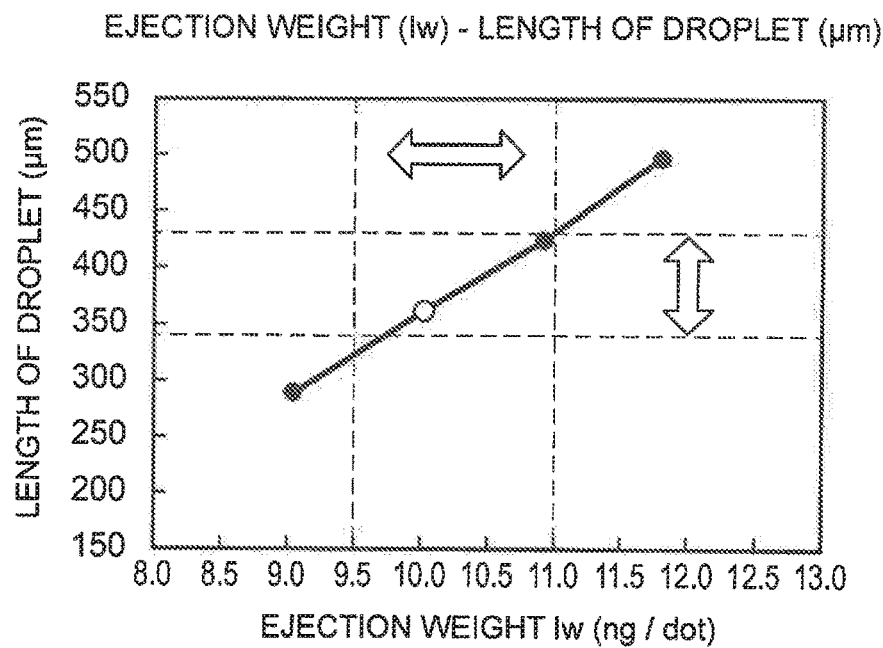
FIG. 28 is a graph showing a relationship between an ejection weight (Iw) and the length of a droplet for the ink of Comparative Example 1.

FIG. 24 is a graph showing a relationship between the driving voltage and the ejection weight (Iw) for the ink of Comparative Example 1. FIG. 25 is a graph showing a relationship between the driving voltage and the ejection velocity (Vm) for the ink of Comparative Example 1. FIG. 26 is a graph showing a relationship between the driving voltage and the length of the droplet for the ink of Comparative Example 1. FIG. 27 is a graph showing a relationship between the ejection weight (Iw) and the ejection velocity (Vm) for the ink of Comparative Example 1. FIG. 28 is a graph showing a relationship between the ejection weight (Iw) and the length of the droplet for the ink of Comparative Example 1.

As shown in FIG. 24, the ejection amount (ejection weight (Iw)) of the ink of Comparative Example 1 can be controlled to 9.5 ng or more and 11.0 ng or less at a driving voltage in the range of 25 V or more and 28 V or less. Similarly, as shown in FIG. 25, the ejection velocity (Vm) can be controlled to 6 m/s or more and 9 m/s or less at a driving voltage in the range of 25.5 V or more and 29 V or less. Further, as shown in FIG. 26, the length of the droplet is about 280 μm even when the driving voltage is set to 24 V. Further, the driving voltage when the ejection amount (ejection weight (Iw)) is 10 ng is about 26 V. Therefore, as shown in FIGS. 27 and 28, by setting the ejection amount (ejection weight (Iw)) to 9.5 ng or more and 11 ng or less and by setting the ejection velocity (Vm) to 6 m/s or more and 9 m/s or less, the length of the droplet becomes about 340 μm or more and 430 μm or less when both ranges are satisfied.

Comparative Example 2

The ink of Comparative Example 2 is basically the same as the ink of Comparative Example 1, however, the frequency of the driving waveform is decreased from 30 kHz to 10 kHz. The reference voltage level of the driving waveform is set to "30" in the same manner as in Comparative Example 1. By doing this, an attempt is made to adjust the length of the droplet by decreasing the ejection velocity (Vm).

Figure 29:
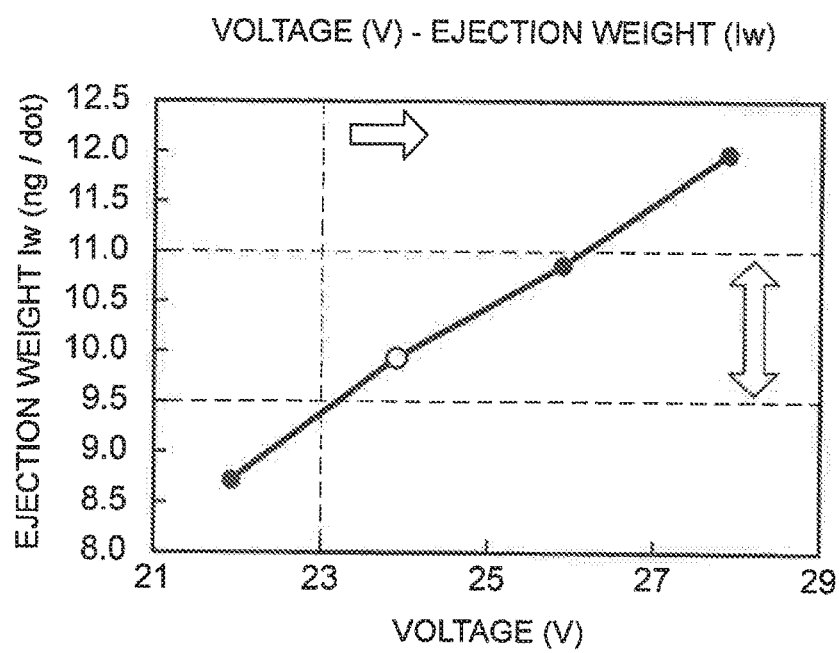
FIG. 29 is a graph showing a relationship between a driving voltage and an ejection weight (Iw) for an ink of Comparative Example 2.
Figure 30:
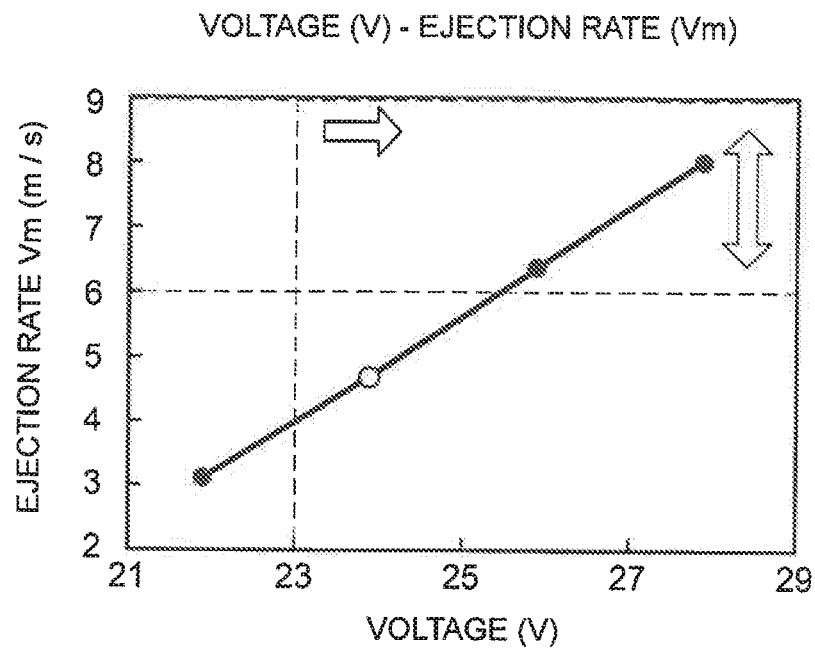
FIG. 30 is a graph showing a relationship between a driving voltage and an ejection velocity (Vm) for the ink of Comparative Example 2.
Figure 31:
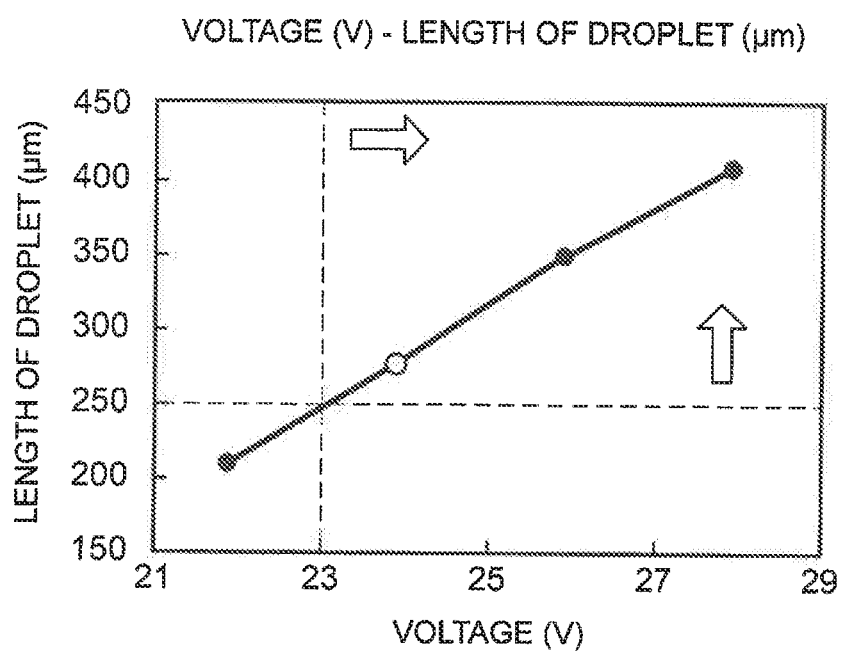
FIG. 31 is a graph showing a relationship between a driving voltage and the length of a droplet for the ink of Comparative Example 2.
Figure 32:
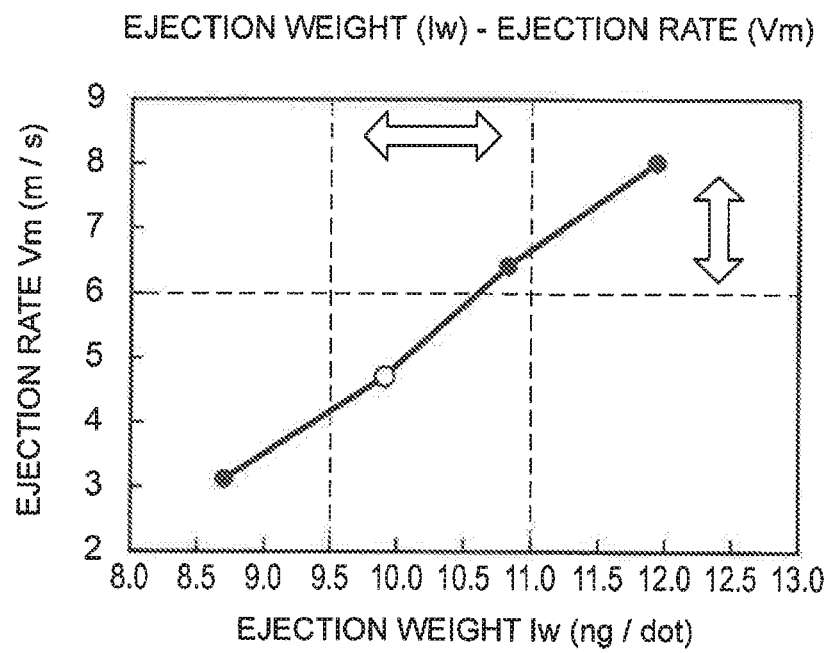
FIG. 32 is a graph showing a relationship between an ejection weight (Iw) and an ejection velocity (Vm) for the ink of Comparative Example 2.
Figure 33:
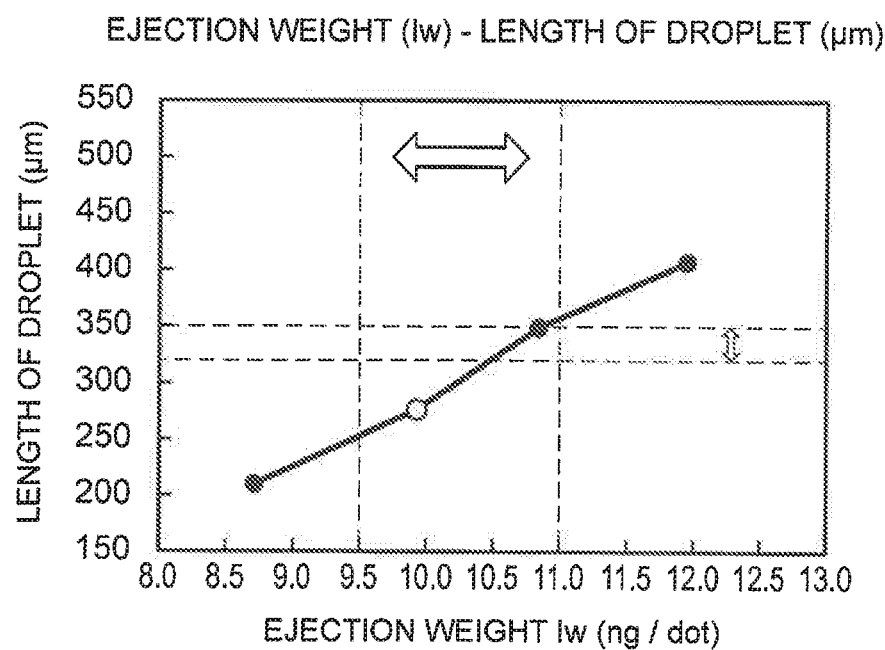
FIG. 33 is a graph showing a relationship between an ejection weight (Iw) and the length of a droplet for the ink of Comparative Example 2.

FIG. 29 is a graph showing a relationship between the driving voltage and the ejection weight (Iw) for the ink of Comparative Example 2. FIG. 30 is a graph showing a relationship between the driving voltage and the ejection velocity (Vm) for the ink of Comparative Example 2. FIG. 31 is a graph showing a relationship between the driving voltage and the length of the droplet for the ink of Comparative Example 2. FIG. 32 is a graph showing a relationship between the ejection weight (Iw) and the ejection velocity (Vm) for the ink of Comparative Example 2. FIG. 33 is a graph showing a relationship between the ejection weight (Iw) and the length of the droplet for the ink of Comparative Example 2.

As shown in FIG. 29, the ejection amount (ejection weight (Iw)) of the ink of Comparative Example 2 can be controlled to 9.5 ng or more and 11.0 ng or less at a driving voltage in the range of 23.5 V or more and 26 V or less. Similarly, as shown in FIG. 30, the ejection velocity (Vm) can be controlled to 6 m/s or more and 9 m/s or less at a driving voltage in the range of 25.5 V or more and 29 V or less. Further, as shown in FIG. 31, the length of the droplet can be made not more than 250 μm when the driving voltage is set to 23 V or less. Further, the driving voltage when the ejection amount (ejection weight (Iw)) is 10 ng is about 24 V. Therefore, as shown in FIGS. 32 and 33, by setting the ejection amount (ejection weight (Iw)) to 9.5 ng or more and 11 ng or less and by setting the ejection velocity (Vm) to 6 m/s or more and 9 m/s or less, the length of the droplet becomes about 320 μm or more and 350 μm or less when both ranges are satisfied.

FIG. 34 is a table summarizing the evaluation for the ejection characteristics and the length of the droplet of each of the inks of Examples and Comparative Examples. As shown in FIG. 34, in the evaluation, the determination item No. 1 is that stable ejection can be performed in the range of the ejection amount (ejection weight (Iw)) from 9.5 ng to 11 ng, the determination item No. 2 is that the driving voltage when 10 ng of the droplet is ejected is 23.0 (V) or less, the determination item No. 3 is that the ejection velocity (Vm) when 10 ng of the droplet is ejected falls within the range of 6 m/s or more and 9 m/s or less, and the determination item No. 4 is that the length of the droplet when 10 ng of the droplet is ejected is 250 μm or less, and the ink which passed all the four determination items was evaluated as "OK (passed)" in the overall determination.

As shown in FIG. 34, all the inks of Example 1 to Example 3 passed the four determination items and were evaluated as "OK (passed)" in the overall determination. On the other hand, the ink of Comparative Example 1 passed the range of the ejection amount (ejection weight (Iw)) and the range of the ejection velocity (Vm), but could not pass the driving voltage and the length of the droplet, and therefore was evaluated as "NG (not passed)" in the overall determination. Further, the ink of Comparative Example 2 passed the range of the ejection amount (ejection weight (Iw)), but could not pass the range of the ejection velocity (Vm), the driving voltage, and the length of the droplet, and therefore was evaluated as "NG (not passed)" in the overall determination.

Further, when an organic EL element 130 was formed using the inks of Example 1 to Example 3, a hole injection layer 131, a hole transport layer 132, and a green (G) light-emitting layer 133, each having a desired film thickness and desired film flatness could be formed in the opening portion 106a.

On the other hand, when a blue light-emitting layer 133 was tried to be formed using each of the inks of Comparative Example 1 and Comparative Example 2, the length of the droplet was long and ejection could not be performed stably, and therefore, a blue light-emitting layer 133 could not be formed.

The invention is not limited to the above-mentioned embodiments, and appropriate modifications are possible without departing from the gist or ideas of the invention readable from the appended claims and the entire specification. An ink thus modified and a method for producing a functional element using the ink are also included in the technical scope of the invention. Other than the above-mentioned embodiments, various modification examples can be made. Hereinafter, modification examples will be described.

Modification Example 1

The inkjet head 20 to which the ink of this embodiment can be applied is not limited to the inkjet head having a piezoelectric element as a driving element. For example, the ink of this embodiment can also be applied to an inkjet head including an electromechanical conversion element which vibrates a diaphragm constituting part of a cavity by static electricity as a driving element, or a heating element which generates an air bubble by heating an ink filled in a cavity and ejects the ink as a droplet by the pressure of the air bubble.

Modification Example 2

The method for producing a functional element to which the ink of this embodiment can be applied is not limited to the method for producing an organic EL element. For example, the ink of this embodiment can also be applied to a method for producing a color filter in which a colored layer of a color filter is formed using an ink containing a coloring material such as a pigment, or a method for producing an organic transistor in which an organic semiconductor layer is formed using an ink containing an organic semiconductor layer forming material. By applying the ink of this embodiment to the method for producing a color filter, color mixing in the colored layer having different colors can be prevented.

Modification Example 3

Figure 35:
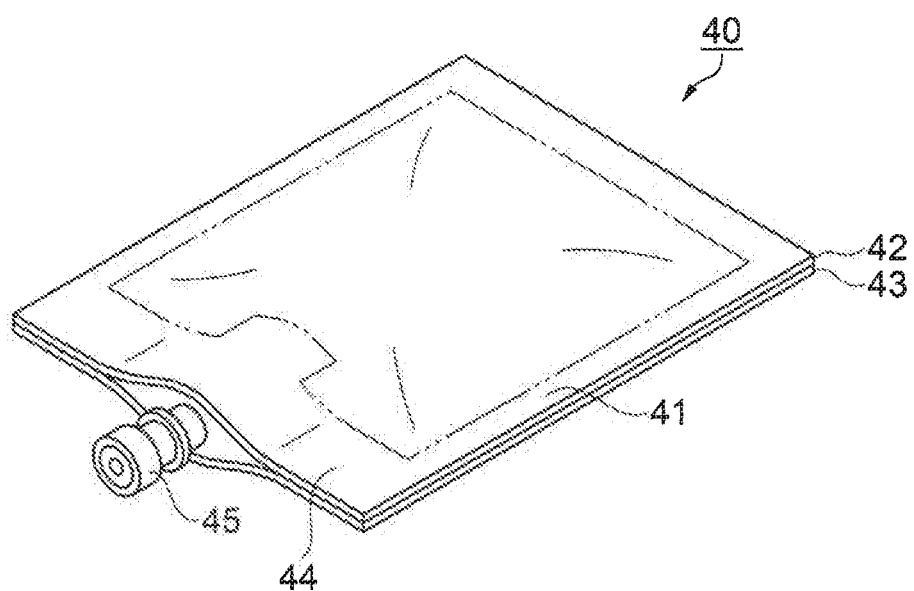
FIG. 35 is a schematic perspective view showing one example of an ink container.

FIG. 35 is a schematic perspective view showing one example of an ink container. As shown in FIG. 35, an ink pack 40 as one example of the ink container includes a liquid storage bag 41 and a communication portion 45 which allows the inside and the outside of the liquid storage bag 41 to communicate with each other. The liquid storage bag 41 is formed into the shape of a bag by overlapping two flexible film members 42 and 43 having a rectangular shape with the same size, and heat-welding the four edges of the members. Further, to one side 44 among the four sides of the liquid storage bag 41, the communication portion 45 is heat-welded in a state where the communication portion 45 is sandwiched by the film members 42 and 43. By doing this, the internal space of the liquid storage bag 41 is sealed, and an ink is filled in the internal space.

Each of the film members 42 and 43 has, for example, a stacked structure in which a gas barrier layer formed by depositing aluminum or the like is sandwiched between thermoplastic resin layers such as polyethylene films. Then, the communication portion 45 is formed from a resin which can be heat-welded to the above-mentioned thermoplastic resin layers of the film members 42 and 43. An ink is filled in the inside of the liquid storage bag 41 through the communication portion 45. When the communication portion 45 is capped, the ink pack 40 filled with the ink can be hermetically sealed. The volume of the ink pack 40 as the ink container is, for example, 500 mL (milliliter). The ink container filled with the ink of this embodiment in this manner is also an important element for exhibiting the performance of the ink and is included in the technical scope of the invention. The ink container is not limited to the ink pack 40, and may be any as long as it can be hermetically sealed, and the housing portion of the ink may be in the form of a rigid cartridge or tank.

The entire disclosure of Japanese Patent Application No. 2015-172603, filed Sep. 2, 2015 is expressly incorporated by reference herein.

What is claimed is:

1. An ink for forming a light emitting layer in an organic electroluminescence (EL) device, ejected as a droplet from a nozzle of an inkjet head, the ink comprising:
   a light emitting material; and
   an aromatic solvent, wherein
   the ejection amount of the droplet is 9.5 ng or more and 11 ng or less,
   the length of the droplet when the droplet is ejected from the nozzle having a diameter size of 27 μm at an ejection velocity of 6 m/sec or more and 9 m/sec or less is 250 μm or less, and
   the light emitting material is a fluorescent material or a phosphorescent material.

2. The ink according to claim 1, wherein
   the inkjet head includes a piezoelectric element as a driving element provided for each nozzle, and a driving voltage for the piezoelectric element when the ejection amount of the droplet is 10 ng is 15 V or more and 32 V or less.

3. An ink container, wherein
the ink container is filled with the ink according to claim 1.

4. An ink container, wherein
the ink container is filled with the ink according to claim 2.

5. A method for producing an organic electroluminescence (EL) device, comprising:
   forming a partition wall which divides a film forming region;
   forming an applied film by using the ink according to claim 1 and ejecting a predetermined amount of the ink as the droplet from the nozzle of the inkjet head to the film forming region; and
   forming the light emitting layer in the film forming region by drying and solidifying the applied film.

6. A method for producing an organic electroluminescence (EL) device, comprising:
   forming a partition wall which divides a film forming region;
   forming an applied film by using the ink according to claim 2 and ejecting a predetermined amount of the ink as the droplet from the nozzle of the inkjet head to the film forming region; and
   forming the light emitting layer in the film forming region by drying and solidifying the applied film.

7. The method for producing an organic electroluminescence (EL) device according to claim 5, wherein
   the length of the droplet is controlled to be less than the distance between the nozzle and a surface on which the light emitting layer is formed using the light emitting material.

8. The method for producing an organic electroluminescence (EL) device according to claim 6, wherein
   the length of the droplet is controlled to be less than the distance between the nozzle and a surface on which the light emitting layer is formed using the light emitting material.

9. An organic electroluminescence (EL) device produced by using the method according to claim 5.

10. An organic electroluminescence (EL) device produced by using the method according to claim 6.

11. An organic electroluminescence (EL) device produced by using the method according to claim 7.

12. An organic electroluminescence (EL) device produced by using the method according to claim 8.

* * * * *